United States Patent [19]
Tani et al.

[11] Patent Number: 5,972,807
[45] Date of Patent: Oct. 26, 1999

[54] PHOTOSENSITIVE, HEAT-RESISTANT RESIN COMPOSITION AND PROCESS FOR USING SAME TO FORM PATTERNS AS WELL AS POLYMERIC COMPOSITE AND PRODUCTION PROCESS THEREOF

[75] Inventors: Motaki Tani; Eiji Horikoshi; Isao Watanabe; Shoichi Miyahara; Takashi Ito; Makoto Sasaki, all of Kawasaki, Japan

[73] Assignee: Fujitsu Limited, Kawasaki, Japan

[21] Appl. No.: 08/772,260

[22] Filed: Dec. 23, 1996

Related U.S. Application Data

[63] Continuation of application No. 08/303,931, Sep. 9, 1994, abandoned, which is a continuation-in-part of application No. 08/064,664, May 21, 1993, which is a continuation-in-part of application No. 07/684,271, Apr. 12, 1991, abandoned.

[30] Foreign Application Priority Data

| Apr. 16, 1990 | [JP] | Japan | 2-099788 |
| Oct. 19, 1990 | [JP] | Japan | 2-279088 |
| May 22, 1992 | [JP] | Japan | 4-130837 |
| Sep. 10, 1993 | [JP] | Japan | 5-248499 |

[51] Int. Cl.⁶ ............................ C08G 73/10; C08L 79/08
[52] U.S. Cl. ......................... 442/63; 442/69; 442/70; 442/164; 525/180; 525/183
[58] Field of Search ................... 525/180, 183; 442/63, 69, 70, 164

[56] References Cited

U.S. PATENT DOCUMENTS

| 4,389,504 | 6/1983 | St. Clair et al. | 524/233 |
| 4,395,518 | 7/1983 | Giles, Jr. et al. | 525/180 |
| 4,416,973 | 11/1983 | Goff | 430/281 |
| 4,987,188 | 1/1991 | Furno et al. | 525/180 |
| 5,438,105 | 8/1995 | Nagata | 525/436 |

FOREIGN PATENT DOCUMENTS 488021  3/1992  Japan .

OTHER PUBLICATIONS

Mat. Res. Soc. Symp. Proc. vol. 264 pp. 37–50.

*Primary Examiner*—Nathan M. Nutter
*Attorney, Agent, or Firm*—Staas & Halsey

[57] ABSTRACT

A film forming, photosensitive, heat-resistant resin composition including a varnish of a polyimide precursor having no photosensitivity in itself, a polymerizable monomer or oligomer compatible with the varnish and capable of providing a high-heat-resistant polymer upon being polymerized, and a polymerization initiator for the monomer or oligomer. The resin composition is useful for the production of circuit substrates and semiconductor devices for high-density mounting, since it can effectively avoid a reduction of the layer thickness during film formation, and ensures a low cost production process. The pattern formation process using such a resin composition is also disclosed. The polymeric composite having a particles-in-matrix microstructure and the production process thereof are also disclosed.

5 Claims, 11 Drawing Sheets

PHOTOSENSITIVE, HEAT-RESISTANT RESIN COMPOSITION AND PROCESS FOR USING SAME TO FORM PATTERNS AS WELL AS POLYMERIC COMPOSITE AND PRODUCTION PROCESS THEREOF

CROSS-REFERENCES TO RELATED APPLICATIONS

This application is a continuation of application Ser. No. 08/303,931, filed Sep. 9, 1994, now abandoned, which application is a continuation-in-part of U.S. patent application Ser. No. 08/064,664, filed on May 21, 1993, which is a continuation-in-part of U.S. patent application Ser. No. 07/684,271, filed on Apr. 12, 1991, now abandoned.

BACKGROUND OF THE INVENTION

1. Field of the Invention

The present invention relates to a film forming, photosensitive, heat-resistant resin composition and a process for the formation of a heat-resistant insulating resin pattern using such composition. The film formed from the photosensitive, heat-resistant resin composition (in the present specification, the term "film" is used in a broad sense to indicate various coatings, films, thin films, etc.) adheres excellently to base materials and has good heat resistance, moisture resistance, insulating properties, toughness, abrasion resistance, and weather resistance, and further, can be formed at a low cost. Further, the process for formation of a pattern according to the present invention is advantageous in that the use of a photoresist for masking is not necessary, and a pattern of heat-resistant insulating resin film formed by this process is useful as one of the components of a circuit board or a semiconductor device, and can be utilized, for example, as a protective film or an insulating film (layer insulating film) in printed circuits, printed boards, wiring boards, and electronic components for high-density mounting. The term "base material" or "base material to be treated" as used in the present specification refers to mean general-use substrates including semiconductor substrates, ceramic substrates, metallic substrates, and various layered films and wiring.

The present invention also relates to a polymeric composite and a production process thereof. More particularly, the present invention relates to a polymeric composite or "polymer blend" having a particles-in-matrix microstructure. A matrix component of the polymeric composite comprises a polyimide resin which has a good heat resistance, and therefore can be advantageously utilized in the fields of electronics, transporting equipments, aircraft and aerospace industries, and a particles component thereof comprises the conventional curable resin, particularly an acrylic resin or a phosphazenic resin. Since it can exhibit an excellent heat resistance, insulating properties and toughness which are characteristic of the polyimide resins including polyimide engineering plastics, and also can show a low stress, the polymeric composite of the present invention can be advantageously used as a heat-resistant insulating layer or film such as a protective film or an interlayer insulator in printed circuits, printed boards and wiring boards and the like for high-density mounting as well as in electronic components or devices.

2. Description of the Related Art

Solder jointing is utilized for mounting IC chips in printed circuits, printed boards, wiring boards and electronic components including multi-chip modules or the like (as exemplified in FIGS. 1 and 2) for high-density mounting, and accordingly, the insulating films used for the above-described circuit substrates should be able to withstand the heat applied during the soldering. Further, since a large amount of information must be rapidly processed, reductions in the size and increases in the capacity of information processors are required. Semiconductor devices constituting a major part of such processors have been integrated through a reduction in the size of unit elements, thus enabling LSIs and VLSIs to be put to practical use. The quantity of heat (heat value) emitted from a semiconductor device increases with an increase in the integration of unit elements, and in an LSI, the heat value amounts to about 10 W.

Integration is achieved by a multi-layerization of the circuit, and when forming a semiconductor integrated circuit element, insulators are needed for layer insulation and surface protection, and inorganic insulators, such as phosphosilicate glass (abbreviated to "PSG"), silicon dioxide ($SiO_2$) and silicon nitride ($Si_3N_4$), are used for this purpose.

Although the above-described inorganic insulators have excellent properties such as dielectric strength and heat resistance, it is difficult to form an insulating film having a large thickness therefrom because inorganic insulating films are formed by a chemical vapor deposition process (abbreviated to "CVD").

The surfaces of semiconductor substrates to be coated with an insulating film have a significant number of fine uneven portions having a large aspect ratio, and inorganic insulating films take on a form which is similar to the form of the surface of the substrate, and this raises the problems of impossibility of smoothing the substrate surface and insufficient coverage.

Accordingly, investigations have been made into the use of polyimide, which can be coated by spin coating and has excellent heat resistance, not only as a surface protective film of a semiconductor integrated circuit element but also as a layer insulating film. A polyimide film for use as a surface protective film or a layer insulating film can be formed by dissolving a polyimide precursor, such as bismaleimide, polyamide acid or diamine, in a solvent, such as N-methyl-2-pyrrolidone (abbreviated to "NMP"), coating the resulting solution on a semiconductor substrate by a method such as spin coating, and heating the coating to a temperature of 150 to 400° C. to cause a cyclodehydration reaction to occur, and thus cause the coating to be cured. The cyclodehydration reaction is also referred to as a polyimidalization reaction. Since the polyimide used herein has no photosensitivity in itself, a fine polyimide pattern may be formed by coating a photoresist on a polyimide precursor film, forming a resist pattern by photolithography, transferring the resist pattern to the lower layer by wet etching or plasma etching to form a pattern comprising a polyimide precursor, and heat-treating the pattern to cause a cyclodehydration reaction to occur, to thereby form a polyimide pattern.

A polyimide having photosensitivity in itself, which enables a polyimide to be patterned to any form, has been developed and is commercially available from various manufacturers. In this photosensitive polyimide, a photosensitive functional group is incorporated in the molecule of a polyimide precursor, and photoreaction occurs only in an exposed portion for polymerization, thereby varying the solubility between the unexposed portion and the exposed portion, and development is then conducted by making use of a solvent to dissolve and remove the unexposed portion while leaving only the exposed portion.

In subsequent heat treatment, the photosensitive groups have a poor heat resistance and are thermally decomposed and removed with the advance of cyclodehydration, so that only the polyimide portions having good heat resistance remain. The photosensitive groups can be introduced into the polyimide precursor through a covalent bond, an ionic bond or the like, and various photosensitive polyimides are commercially available.

The use of the above-described photosensitive polyimides, however, have the problem of high cost of the photosensitive polyimide per se, in addition to a large reduction in the film thickness which occurs as a result of the decomposition of a photosensitive group. Further, both non-photosensitive polyimides and photosensitive polyimides have the problem of poor moisture resistance.

For reference, the following patents may be mentioned as examples of patents describing processes for the formation of a pattern.

Japanese Unexamined Patent Publication (Kokai) No. 56-22428 discloses a process for the formation of a polyimide pattern, characterized by comprising the steps of (1) forming a film of a photosensitive polyimide precursor on a substrate; (2) irradiating the film with light in a pattern form and conducting development of the pattern; (3) heating the developed polyimide precursor pattern to convert the pattern to a polyimide pattern; and (4) treating the resultant polyimide pattern with an etchant for polyimide. A polyimide precursor bonded to a photosensitive group through a chemical bond or mixed with a photosensitive compound (such as bichromate) is used as the photosensitive polyimide precursor. In this process, the development residue of unexposed portions can be easily removed, so that through-holes free from defects can be obtained.

Japanese Unexamined Patent Publication (Kokai) No. 59-107346 discloses a heat-resistant photosensitive material comprising a photosensitive polyimide precursor including structural units represented by the following formula:

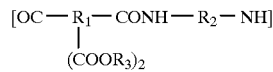

wherein $R_1$ and $R_2$ are each an aromatic ring group, $R_3$ is a thietane ring, and $COOR_3$ is bonded to the amide group at its ortho-position. An insulating, heat-resistant polyimide pattern having good adhesion to the semiconductor substrate can be prepared through the use of such photosensitive material in the formation of a pattern.

In addition to these Japanese Kokais, although it is not considered to be relevant to the present invention, Japanese Unexamined Patent Publication (Kokai) No. 54-109828 discloses a heat-resistant photoresist composition which comprises 100 parts by weight of at least one polymer selected from a variety of organic polar solvent-soluble, heat-resistant polymers including polyimide, and 0.1 to 100 parts by weight, preferably 1 to 50 parts by weight of a monomeric compound containing at least two ethylenically unsaturated double bonds in its molecule. The amount of the monomeric compound incorporated into the heat-resistant polymer should not exceed 100 parts by weight, because larger amounts cause a reduction of the heat resistance of the resulting photoresist. This is because the specified monomeric compounds do not exhibit excellent heat resistance after curing of the resist.

The use of photosensitive polyimides as layer-insulating films in the production of integrated circuits wherein a considerable amount of heat is generated during use is desired in the art. As described above, photosensitive polyimides, however, have the problem of lowering the precision of the pattern due to the reduction in the film thickness resulting from the decomposition of the photosensitive groups during heat-treating of the photosensitive polyimide precursor to convert it into a polyimide, and further, photosensitive polyimides have the problem of the high cost of the material per se.

With regard to the use of the polyimide or polyimide resins, it is also well-known from Japanese Unexamined Patent Publication (Kokai) Nos. 62-30122, 63-86746 and 63-175854, for example, that the polyimide is mixed with curable resins or other additives such as polymaleimides, or novolak resins to form a polyimide resin composition useful in the formation of films or other molded articles having an excellent heat resistance and molding properties. However, the prior art publications including these Japanese Publications do not teach novel polymeric composite and production process thereof according to the present invention which will be described in detail hereinafter.

Further, hereinbefore, the polyimide resins including polyimide engineering plastics have been used in the formation of heat-resistant insulating layers, for example, protective films or interlayer insulators in the high-density mounting printed circuits, printed boards, electronic components and other devices. Because of lower dielectric constant thereof than that of conventional inorganic insulating materials, it is widely recognized that the polyimide resins are effective to improve characteristics of the integrated circuit (IC) devices, and in practice, they are able to ensure potential advantages such as passivation and interlayer insulation in microelectronics devices. Note that the polyimide insulators are considered to be more preferable than the inorganic insulators, because they generally have a dielectric constant of about 3.5 and also exhibit many excellent thermal and mechanical properties.

However, the polyimide resins, if used as the protective film or interlayer insulator in electronics and microelectronics devices including semiconductor devices, suffer from problems such as warpage of wafers and crack of chips. These defects are caused due to a large difference in a thermal coefficient of expansion (TCE) between the polyimide resins and the underlying materials such as aluminum as the wiring material or silicon dioxide ($SiO_2$) as the passivation material, and can be varied depending upon the film thickness of the polyimide resins and the layer structure of the devices.

The defects due to the above-mentioned large difference in TCE can be reduced by using the polyimide resins having a low TCE as is disclosed, for example, in Japanese Unexamined Patent Publication (Kokai) No. 4-224824; U.S. Pat. No. 4,690,999; and Y. Misawa et al., IEEE Transactions on Electron Devices, ED-34, No. 3, March 1987. However, even if the low TCE resins are used, the defects cannot be avoided, when the polyimide resins are used at an increased thickness of film or the polyimide resins are subjected to the radiation exposure process.

In addition to the above drawbacks, recently developed photosensitive polyimide resins have problems that upon postbaking of the resins for obtaining the corresponding polyimide, a loss in the thickness of the resulting polyimide film can be increased to about 50% or more and also a stress of the film can be increased in comparison with the case using photoinsensitive polyimide resins, since photosensitive groups having a large molecular weight are volatilized from the film, along with water as a byproduct.

SUMMARY OF THE INVENTION

Accordingly, an object of the present invention is to provide a film forming, photosensitive, heat-resistant resin composition which is useful in the production of circuit substrates and semiconductor devices for high-density mounting including multi-chip modules or the like, such as printed circuits, printed boards, wiring boards and electronic components, which causes no reduction in film thickness during the formation of a film therefrom, and which is low in cost.

Another object of the present invention is to provide an improved process for the formation of a heat-resistant insulating resin pattern through the use of the photosensitive, heat-resistant resin composition of the present invention, without the aid of a photoresist.

Still another object of the present invention is to provide a circuit board produced by using the above pattern formation process.

It is also an object of the invention to provide a film of a heat-resistant resin which is obtained from the resin composition of the present invention.

In addition to these objects, another object of the present invention is to provide a novel polymeric composite or polymer blend which has a particle-in-matrix microstructure and is characterized by notably low stress.

Another object of the present invention is to provide a process for the production of such novel polymeric composite. It is desired that the production process is effective to freely control a size of the particles in the resulting polymeric composite.

Still another object of the present invention is to provide a low-stress insulating layer of polyimide base.

To attain these objects, the present inventors have conducted intensive and extensive studies, and as a result, it has been found that the use of a polyimide precursor having no photosensitivity in itself in combination with a particular polymerizable monomer or oligomer can eliminate the problems of conventional photosensitive polyimides, and further, enables the formation of polyimide films for use as surface protective films or layer-insulating films at a much lower cost than that of the conventional processes.

According to one aspect of the present invention, there is provided a film forming, photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer. The composition is designed for use in a polymerization process in which said monomer or oligomer is polymerized and simultaneously or subsequently the composition is heated to cause a cyclodehydration reaction to occur and cure (i.e. polymerize) said polyimide precursor.

In a particularly preferred embodiment, the composition of the present invention contains an acrylic monomer or oligomer compatible with said varnish and capable of providing a high-heat-resistant polymer upon being polymerized, as the polymerizable monomer, and a dimeric imidazole compound, as the polymerization initiator. The inventors have found that the resin composition preferentially containing a certain dimeric imidazole polymerization initiator provides an excellent polymerized film showing a reduced surface roughness and having a large thickness and high heat-resistance.

According to another aspect of the present invention, there is provided a process for the formation of a pattern, which comprises the steps of: coating a base material to be treated with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for the monomer or oligomer; exposing the resultant coating of the photosensitive, heat-resistant resin composition to conditions capable of inducing polymerization of the polymerizable monomer or oligomer in a predetermined pattern, thereby selectively polymerizing the monomer or oligomer at preselected regions; selectively removing the coating from the base material at regions other than said preselected regions where a polymer of the monomer or oligomer has been formed; and heat-treating the residual coating to cause a cyclodehydration reaction to occur and cure the polyimide precursor contained in the coating.

According to another aspect of the present invention, there is provided a circuit board which comprises a substrate, at least two electrically conductive layers applied over the substrate, a layer-insulating film for insulating the electrically conductive layers from each other, and said layer-insulating film having a viahole therethrough, an interlayer conductor occupying said viahole in the layer-insulating film for electrically interconnecting the electrically conductive layers, said viahole-containing layer-insulating film having been prepared by the steps of:

coating one of said electrically conductive layers with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer;

exposing the resultant coating of the photosensitive, heat-resistant resin composition to conditions capable of inducing polymerization of said polymerizable monomer or oligomer in a predetermined pattern, thereby selectively polymerizing said monomer or oligomer at preselected regions;

selectively removing said coating from said one electrically conductive layer at regions other than said preselected regions where a polymer of said monomer or oligomer has been formed; and heat-treating the residual coating to cause a cyclodehydration reaction to occur and cure said polyimide precursor contained in the coating. The substrate used herein is preferably a member selected from the group consisting of semiconductor substrates, ceramic substrates, metallic substrates, inorganic substrates and organic substrates.

According to a further aspect of the present invention, there is provided a film of a heat-resistant resin of polymer blend, the polymer blend being made up of a polymer resulting from a polyimide precursor and a polymer resulting from the polymerization of a monomer or oligomer in the presence of a polymerization initiator, and the film being formed by:

coating a base material with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer;

exposing the resultant coating of the photosensitive, heat-resistant resin composition to conditions capable of inducing polymerization of said polymerizable monomer or oligomer, thereby selectively polymerizing said monomer or oligomer at preselected regions;

selectively removing said coating from said base material at regions other than said preselected regions where a polymer of said monomer or oligomer has been formed; and heat-treating the residual coating to cause a cyclodehydration reaction to occur and cure said polyimide precursor contained in the coating.

In addition, according to another aspect of the present invention, there is provided a polymeric composite having a particles-in-matrix microstructure which comprises a matrix component essentially consisting of a polyimide resin produced from tetracarboxylic acid dianhydride, aromatic diamine and polyhydric amine as principal components thereof, having distributed therein a particles component essentially consisting of a curable resin.

According to still another object of the present invention, there is provided a process for the production of a polymeric composite having a particles-in-matrix microstructure, which comprises the steps of:

preparing a mixed solution as a polymeric gel of a polyamic acid which comprises tetracarboxylic acid dianhydride, aromatic diamine and polyhydric amine as principal components thereof, and an uncured curable resin;

evaporating a solvent from said mixed solution to provide a particles-in-matrix microstructure comprising the polyamic acid and the uncured curable resin; and during or after curing of said curable resin, subjecting said polyamic acid to the condition capable of causing a cyclodehydration reaction thereof to form a polyimide resin, thereby providing a particles-in-matrix microstructure which comprises a matrix component essentially consisting of the polyimide resin having distributed therein a particles component essentially consisting of the cured resin.

In the production process according to the present invention, it is preferred that the mixed solution is maintained at a temperature of 30 to 200° C. to produce a particles-in-matrix microstructure comprising the polyamic acid as a matrix component and the uncured curable resin as a particles component, with evaporation of a solvent from the solution, and then the curing of the curable resin and the cyclodehydration reaction of the polyamic acid are carried out in the recited sequence.

In the process of the present invention, it is also preferred that after curing of said curable resin, said polyamic acid is selectively dissolved off from a surface portion of the a particles-in-matrix microstructure to expose particles of said cured resin, and then the thus obtained particles-in-matrix microstructure having a roughened surface is subjected to the condition capable of causing a cyclodehydration reaction of said polyamic acid; and that after formation of said particles-in-matrix microstructure comprising the polyamic acid and the uncured curable resin, the particles of the curable resin are selectively cured in the selected areas of said structure, said polyamic acid and said uncured curable resin are selectively dissolved off from the unselected areas of said structure, and then said structure is subjected to the condition capable of causing a cyclodehydration reaction of the polyamic acid in said selected areas to thereby form a patterned polymeric composite having a particles-in-matrix microstructure.

The process of the present invention can be advantageously used in the patterned film or layer of the polymeric composite and, in such instances, it is preferred that said mixed solution of polyamic acid and an uncured curable resin is coated over a substrate to finally obtain a patterned layer of the polymeric composite on the substrate.

According to still another object of the present invention, there is provided a process for the production of a polymeric composite having a particles-in-matrix microstructure, which comprises the steps of:

preparing a dispersion of finely divided particles of an acrylic resin or a phosphazenic resin in a solution of polyamic acid which comprises tetracarboxylic acid dianhydride, aromatic diamine and polyhydric amine as principal components thereof; and subjecting the dispersion to the condition capable of causing a cyclodehydration reaction of said polyamic acid to form a polyimide resin, thereby providing a particles-in-matrix microstructure which comprises a matrix component essentially consisting of a polyimide resin matrix having dispersed therein a particles component essentially consisting of the finely divided particles of said acrylic or phosphazenic resin.

In the production process of the present invention in which finely divided particles of the acrylic or phosphazenic resin are used as a particles component, it is preferred that the resin particles have an average particle size of 5 $\mu$m or less.

The first feature of the present invention, as will be appreciated from the detailed description of this specification, resides in the findings that if a mixed solution of a polyamic acid, principal components of which are tetracarboxylic acid dianhydride, aromatic diamine and polyhydric amine, and an uncured curable resin is prepared and then any solvent is evaporated off by, for example, retaining the solution at a predetermined temperature, a particles-in-matrix microstructure comprising a polyamic acid and a curable resin, especially a particles-in-matrix microstructure comprising a polyamic acid as a matrix component and a curable resin as a particles component can be produced, because there is no good compatibility between the polyamic acid and the curable resin, and that the resulting particles-in-matrix microstructure can be maintained without decomposition thereof due to curing of the curable resin and the cyclodehydration reaction of the polyamic acid.

The inventors have also found that in the phase of the curable resin constituting particles of the particles-in-matrix microstructure, a size of the particles can be optionally changed depending upon desired results and other factors, because a particle size of the particles can be reduced with increase of the temperature and time for the evaporation or heating step.

The second feature of the present invention resides in the findings that after formation of a particles-in-matrix microstructure comprising a polyamic acid as a matrix component and a curable resin as a particles component, if the curable resin is first cured and then the polyamic acid contained in the surface portion of the structure is selectively eluted to expose the particles of the cured resin, a roughened surface, i.e., fine depressions and protrusions (uneven portions) can be produced in the final particles-in-matrix microstructure, and that the roughened surface can be still maintained after completion of the cyclodehydration reaction of the polyamic acid. Note that the roughened surface is particularly effective when the polymeric composite is used as an insulating film of semiconductor devices and for other purposes, because it enables to improve a fixability of an electrically conductive layer or the like to the underlying insulating film.

The third feature of the present invention resides in the findings that after formation of a particles-in-matrix microstructure comprising a polyamic acid as a matrix component and a curable resin as a particles component, if the curable resin is first selectively cured only in the selected areas of the structure, and then the polyamic acid and the uncured curable resin are dissolved, the polyamic acid and the uncured curable resin in other areas than the said selected areas (i.e., non-selected areas) can be selectively eluted from the non-selected areas of the structure, on the other words, patterns of the particles-in-matrix microstructure can be produced. The inventors have also found that in the resulting patterns of the particles-in-matrix microstructure, the cyclodehydration reaction of the remaining polyamic acid can result in patterns of a polymeric composite consisting of the polyimide resin as a matrix component and the cured resin as a particles component, and that selective curing of the curable resin can be advantageously carried out with exposure to radiations such as ultraviolet (UV) radiations.

DESCRIPTION OF THE PREFERRED EMBODIMENTS

Figure 1:
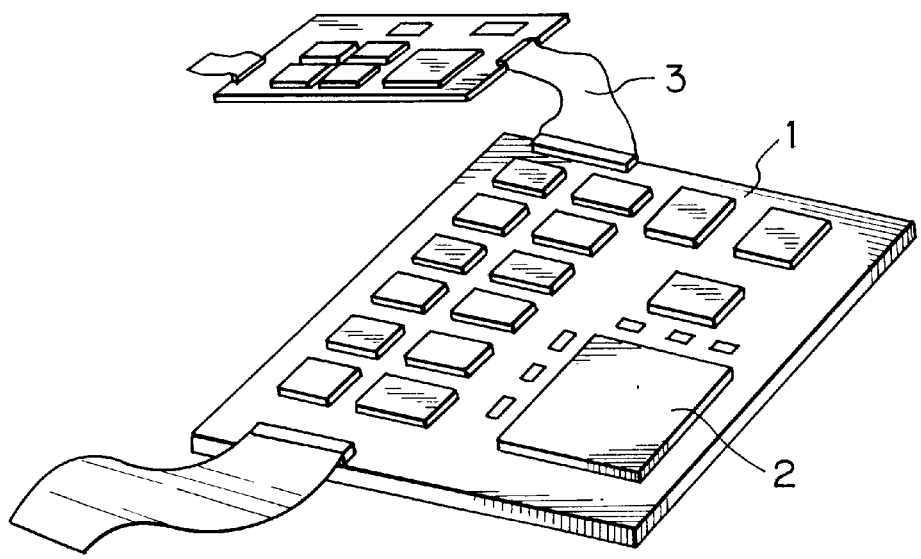
FIG. 1 is a perspective view showing one embodiment of a prior art multi-chip module to which the present invention is applicable.

In the present invention, a film forming, photosensitive, heat-resistant resin composition is prepared through a combination of a polyimide precursor having no photosensitivity in itself with, for example, an acrylic or methacrylic monomer or oligomer, a phosphazenic monomer or oligomer, or some other polymerizable monomer or oligomer and a polymerization initiator. The functions of the present invention will now be described by way of an embodiment, wherein the polymerizable monomer or oligomer is photopolymerizable.

As described above, the present inventors have studied processes whereby the problems of photosensitive polyimides can be eliminated, and further, whereby polyimide films for layer-insulating layers may be formed at much lower costs than conventional processes. As a result it has been found that, when a base material to be treated is coated with a mixture of a photopolymerizable monomer or oligomer having excellent heat resistance properties and a varnish of a polyimide precursor, subjected to selective exposure through the use of a mask or the like and then developed, the varnish of the polyimide precursor at non-exposed portions may be dissolved and removed together with the monomer or oligomer therein while the varnish of the polyimide precursor at exposed portions remains as it is together with a polymer derived from the monomer or oligomer.

When the varnish of the polyimide precursor and the polymer derived from the monomer or oligomer remaining at the exposed portions is then heat-treated, a cyclodehydration reaction involving the polyimide precursor proceeds, thus causing the polyimide precursor to be converted into a polyimide. Nevertheless, since the polyimide resin pattern thus formed is a mixture or copolymer of a polyimide with the polymer of the monomer or oligomer, the heat resistance is inferior to that of a pattern consisting of a polyimide only. It should be noted that the fact that the polyimide resin pattern is a mixture or copolymer of a polyimide with the polymer is not yet completely clarified, but it will be described hereinafter with reference to FIGS. 4A to 4C. In this case, the use of a photopolymerizable monomer having excellent heat resistance properties as the photopolymerizable monomer or oligomer enables the electrical properties required in electronic components, such as heat resistance and insulating properties, to be sufficiently maintained.

Specifically, in JIS (Japanese Industrial Standard) standards, the heat resistance during soldering at 270° C. is specified as the heat resistance of electronic components, and the photosensitive, heat-resistant resin derived from the photosensitive, heat-resistant resin composition can sufficiently maintain the heat resistance specified in the JIS standards.

As a result of experiments, the present inventors have found that the properties of the photosensitive, heat-resistant resin depend upon the properties of the photopolymerizable monomer or oligomer and photopolymerization initiator, rather than the varnish of the polyimide precursor.

In the practice of the present invention, a precursor of any one of a variety of polyimides (including modified polymers) can be used. According to the findings of the present inventors, the polyimide precursor may be prepared according to need or a commercial availability, and no significant difference is observed in the effect of these polyimides. Suitable polyimide precursors may be a member selected from the group consisting of precursors of polyimides, precursors of modified polyimides, precursors of polybismaleimides and precursors of modified polybismaleimides. Similarly, polyimide engineering plastics also may be used. The above-described precursors may be used alone or in the form of a mixture thereof.

The polymerizable monomer or oligomer compatible with the varnish and capable of providing a high-heat-resistant polymer upon being polymerized is preferably an acrylic or methacrylic monomer or oligomer, and examples thereof include compounds having at least two functionalities (in other words, at least two reactive groups having an unsaturated bond) in their molecules, compounds having an isocyanurate structure, compounds having an acryloyl or methacryloyl group in a terminal and/or a side chain in theirs molecules, oligoester acrylates and phosphazenic monomers or oligomers. The above-described polymerizable monomers or oligomers can usually be polymerized through the action of light, heat and the like, and photopolymerizable or heat polymerizable monomers or oligomers are preferred.

The present inventors have studied photopolymerizable monomers or oligomers which have good compatibility with the polyimide precursor and which are capable of providing a polymer having good heat resistance, and as a result, it has been found that acrylic or methacrylic monomers or oligomers which are commonly used as ultraviolet light curable adhesives are suitable.

Specifically, polyester acrylate, epoxy acrylate, urethane acrylate and silicone acrylate monomers or oligomers are useful as the acrylic or methacrylic monomer or oligomer. In particular, polyfunctional acrylate monomers or oligomers having an isocyanurate structure, for example, tris (acryloyloxyethyl) isocyanurate, isocyanuric acid EO (n=3) .ε-caprolactone modified triacrylate, and branched polyfunctional acrylate monomers or oligomers, for example, trimethylolpropane triacrylate, EO-modified trimethylolpropane triacrylate, pentaerythritol triacrylate, pentaerythritol tetraacrylate, and pentaerythritol hexaacrylate are useful. Further, methacrylic monomers or oligomers also can be similarly used, although a slight lowering in photosensitivity is observed. In particular, it has been found that when a lowering of the dielectric constant of the insulating film is intended, a blend of an acrylic or methacrylic fluoromonomer or fluorooligomer provides good results.

Further, the present inventors have found that inorganic polymer precursors used in ultraviolet light curable coating materials, especially phosphazenic monomers or oligomers and precursors (monomers or oligomers) of silicon-containing polymers also are suitable as the polymerizable monomer or oligomer.

The phosphazene compounds are known to be coating materials having good heat resistance (see Japanese Unexamined Patent Publication (Kokai) No. 63-241075). In the invention described in this publication, the phosphazene compounds are intended for use as coating materials for protecting the surface of decorative sheets, woods, plastics, paper, and clothes. For this reason, even if the phosphazene compound is used as a filler, the filler is limited to inorganic fillers and inorganic materials such as silica, and the disclosure does not concern itself with the use of the phosphazene compound in combination with an organic material. Further, unlike the present invention, the above-described publication does not disclose applications wherein the phosphazene compound is combined with a polyimide precursor for use as a photosensitive insulating film which is selectively patterned in the same manner as previously known photosensitive polyimides.

The phosphazenic monomer is preferably the following one wherein the chloro portion of the hexachlorocyclotriphosphazene [3PNC] is substituted with, for example, an acrylate group, a methacrylate group, a vinyl group, or an allyl group.

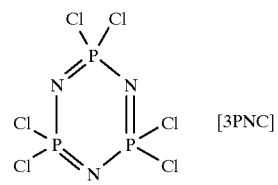

Specific examples include the residues formed by removing a hydrogen atom from a hydroxyl group in methacrylates such as 2-hydroxyethyl methacrylate, 2-hydroxypropyl methacrylate and 2-hydroxymethyl methacrylate (a hydroxyalkyl methacrylate residue), and residues formed by removing a hydrogen atom from a hydroxyl group in acrylates such as 2-hydroxyethyl acrylate, 2-hydroxybutyl acrylate and 3-hydroxy-2-tertbutyl-propyl acrylate (a hydroxyalkyl acrylate residue).

Residues formed by removing a hydrogen atom from a hydroxyl group in 2-hydroxyethyl methacrylate and by removing a hydrogen atom from a hydroxyl group in 2-hydroxyethyl acrylate are particularly preferred. When the above-described various hydroxyalkyl methacrylate residues are compared with the hydroxyalkyl acrylate residues, the hydroxyalkyl acrylate residues are considered better because the crosslinking rate is higher. Further, the use of these residues in the form of a mixture thereof with a polyfunctional acrylate or methacrylate monomer not containing any inorganic material is also possible.

Further, the present inventors have found that the following acrylic oligomers, which have been used as ultraviolet light curable adhesives, are also suitable as polymerizable oligomers.

It has been found that oligomers or oligoester acrylates having a methacryloyl group in a terminal or side chain are especially useful as the acrylic oligomer. Except for special cases, oligomers having an acryloyl group provide higher reactivity and sensitivity than oligomers having a methacryloyl group. More specifically, it has been found that trifunctional or higher functional acrylic oligomers having the following structure are particularly useful:

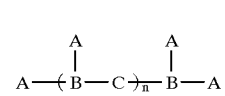

wherein
A is an acrylic acid, for example, acrylic acid or methacrylic acid;
B is a polyhydric alcohol, for example, 2-ethyl-2-hydroxymethyl-1,3-propanediol or pentaerythritol;
C is a polybasic acid, for example, 3-cyclohexene-1,2-dicarboxylic acid or 4-cyclohexene-1,2-dicarboxylic acid; and
n denotes an integer having a value of one or more, and preferably 1 to 20.

The polymerization of the polymerizable monomers or oligomers as listed above is induced and proceeds in the presence of a polymerization initiator through the action of light, heat or the like. Specifically, when the polymerization initiator is irradiated with light or heat, radicals are generated from the polymerization initiator and such radicals induce the polymerization of the monomer or oligomer. The present inventors have made studies with a view to finding a polymerization initiator useful for the practice of the present invention, and as a result, have found that compounds well known to be capable of generating radicals through the action of light, for example, benzoin ether compounds, ketalin ether compounds, ketal compounds, acetophenone compounds, benzophenone compounds, thioxanthone compounds, organic peroxides, N-phenylglycine, triazine compounds and allene-iron complexes, are suitable. Typical examples of polymerization initiators are as follows, but it should be understood that the polymerization initiator is not limited to these compounds only.

Benzoin ether compounds:
  isopropyl benzoin ether, isobutyl benzoin ether, etc.
Ketal compounds:
  1-hydroxycyclohexyl phenyl ketone, benzyl dimethyl ketal, etc.
Acetophenone compounds:
  acetophenone, 2-hydroxy-2-methylpropiophenone, 4-isopropyl-2-hydroxy-2-methylpropiophenone, etc.
Benzophenone compounds:
  benzophenone, methyl o-benzoylbenzoate, etc.
Thioxanthone compounds:
  2-methylthioxanthone, 2-chlorothioxanthone, etc.
Organic peroxides:
  ketone peroxide, peroxy ketal, hydroperoxide, dialkyl peroxide, diacyl peroxide, peroxy ester, peroxy dicarbonate, etc.
Triazine compounds:
  Compounds having a 1,3,5-triazine structure and at least one trichloromethyl group in the molecule, such as 2,4,6-tris(trichloromethyl)-1,3,5-triazine and 2,4-bis(trichloromethyl)-6-phenyl-1,3,5-triazine.
Allene-iron complexes:
  ($\eta^6$-benzene) ($\eta^5$-cyclopentadienyl) iron (II) hexafluorophosphate, ($\eta^6$-pyrene) ($\eta^5$-cyclopentadienyl) iron (II) hexafluoroantimonate, ($\eta^6$-naphthalene) ($\eta^5$-cyclopentadienyl) iron (II) hexafluorophosphate, etc.

The above-described polymerization initiators may be used alone or in the form of a mixture thereof. Further, it is possible to enhance the sensitivity through exposure at an optimal wavelength.

The inventors have found that a composition which uses a polymerization initiator of dimeric imidazole compound exhibits a particularly high sensitivety and provides an excellent polymerized film. In a particularly preferred embodiment, the composition of the present invention therefore contains a dimeric imidazole compound as the polymerization initiator for a polymerizable monomer or oligomer.

Preferred dimeric imidazole compounds are exemplified by 2-(o-chlorophenyl)-4,5-bis(m-methoxyphenyl)-imidazole dimer, 2,2'-bis(o-chlorophenyl)-4,4',5,5'-tetraphenyl-1,2'-biimidazole, 1H-imidazole, and 2,5-bis(o-chlorophenyl)-4-(3,4-dimethoxyphenyl)-dimer. Particularly preferred is 2,2'-bis(o-chlorophenyl)-4,4',5,5'-tetraphenyl-1,2'-biimidazole.

In the particularly preferred embodiment of a composition containing a dimeric imidazole compound, a useful polymerizable monomer or oligomer is an acrylic monomer or oligomer, or oligoester acrylate, which has an acryloyl or methacryloyl group preferably in its terminal or side chain. Except for special cases, a monomer or oligomer having an acryloyl group generally provides not only a higher reactivity but also a higher sensitivity than a monomer or oligomer having a methacryloyl group. More particularly, an acrylic oligomer having a tri- or more functionality is especially useful which has the above indicated structural formula (I).

As described before, the polymerization of the polymerizable monomers or oligomers is induced and proceeds in the presence of a polymerization initiator through the action of light, heat or the like. Specifically, when the polymerization initiator is irradiated with light or heat, radicals are generated from the polymerization initiator and such radicals induce the polymerization of the monomer or oligomer. The present inventors have made studies with a view to finding a polymerization initiator useful for the practice of the present invention, and as a result, have found that dimeric imidazole compounds referred to above provide a particularly superior sensitivity and a polymerized film when combined with a preferred acrylic monomer or oligomer.

Further, the use of the above-described polymerization initiators in combination with a sensitizer is recommended from the viewpoint of the effect. Examples of suitable sensitizers include di-n-butylamine, n-butylamine, triethylamine and triethylenetetramine and further ketocoumarin dyes, coumarin dyes, thioxanthene dyes, xanthene dyes and thiopyrylium salt dyes.

In the photosensitive, heat-resistant resin composition according to the present invention, the mixing proportions of the polyimide precursor, polymerizable monomer or oligomer and polymerization initiator may be widely varied depending upon factors such as desired results. The present inventors have found that the above-described acrylic monomer or oligomer in an amount of 10 to 500% by weight based on the polyimide precursor (weight of the polyimide precursor contained in the varnish) and the polymerization initiator in an amount of 0.1 to 50% by weight based on the monomer or oligomer are useful. Since the polymerizable monomer or oligomer is more inexpensive than the polyimide precursor, the cost of the resultant photosensitive, heat-resistant resin film or pattern per se formed therefrom drops with an increase in the amount of the monomer or oligomer in the composition. Further, the photosensitivity is increased with an increase in the amount of the monomer or oligomer and photopolymerization initiator in the composition.

The formation of the heat-resistant, insulating resin pattern according to the present invention starts with the coating of the photosensitive, heat-resistant resin composition on the base material to be treated. The coating is conducted by uniformly applying a resin composition in the form of a photosensitive liquid or the like onto the surface of a selected base material. The base material may be a ceramic substrate such as alumina ($Al_2O_3$) or a metallic substrate. Further the base material may be a semiconductor substrate (for example, a silicon substrate or a sapphire substrate) or the like in the case of use as a circuit substrate, a printed board or a wiring board for high-density mounting of components including multi-chip modules, and the substrate may be coated using a conventional coating process, such as spin coating, dip coating or doctor blade coating. The coating of the photosensitive, heat-resistant resin composition thus formed is prebaked at a properly elevated temperature so as to evaporate to some extent, the solvent contained therein (the varnish of the polyimide precursor usually contains 80% by weight or more of N-methyl-2-pyrrolidone as a solvent).

After the prebaking, the resultant coating is exposed to conditions capable of inducing polymerization of the polymerizable monomer or oligomer in a predetermined pattern (corresponding to the pattern of an intended heat-resistant, insulating resin film). Preferably, a pattern of light necessary for generating radicals from the simultaneously used polymerization initiator is applied to the coating, or a pattern of heat necessary for generating such radicals is applied to the coating. Specifically, a selective irradiation with light, such as ultraviolet light, is conducted through a mask. Consequently, only the polymerizable monomer or oligomer contained in the exposed portion (or heated portion) is selectively polymerized.

Then, in the coating, the regions other than those where a polymer has been formed from the monomer or oligomer are selectively removed. A development process wherein use is made of a developing solution comprising a solvent capable of dissolving the polyimide precursor and polymerizable monomer or oligomer can be advantageously employed for the above-described removal.

Subsequently, the remaining coating which has not been dissolved or removed during the development process is heat-treated to polymerize the polyimide precursor in the coating. The heat treatment temperature (heating temperature) in this step is not particularly limited as long as the polyimide precursor is converted into a polyimide without decomposition of the polymerizable monomer or oligomer. In general, however, the temperature is preferably about 250 to 350° C.

According to the process of the present invention, a pattern of a heat-resistant, insulating resin having satisfactory properties can be obtained at low cost through the above-described series of steps. Further, it is also advantageously possible to form an unpatterned photosensitive, heat-resistant resin film through the use of this process.

Figure 2:
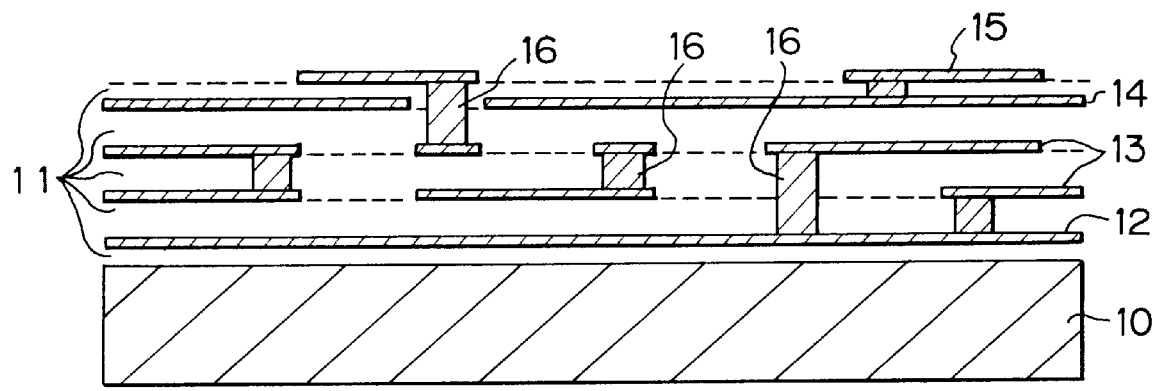
FIG. 2 is a cross-sectional view of the multi-chip module of FIG. 1.

As described above, the present invention can be advantageously used for the production of multi-chip modules. An embodiment of such a multi-chip module is shown in FIGS. 1 (appearance) and FIG. 2 (cross-section). Specifically, the multi-chip module shown in the drawings is provided with an LSI chip 2 mounted on a substrate 1 and further with a flexible printed board 3. As shown in FIG. 2, this multi-chip module has a layer structure such that, for example, layer-insulating films 11 of the present invention, a grounding layer 12, a signal layer 13, an electric power supply layer 14 and a surface electrode layer 15 are successively laminated onto a substrate 10, such as a silicon wafer or a ceramic substrate. Interlayer conductors 16 are formed in viaholes interconnecting the various conductive layers as shown.

Generally speaking, the multi-chip modules to which the present invention can be applied have a minimum size of approximately 5 cm×5 cm and include, for example, silicon (Si) wafers having a diameter of 3 in. or plates of glass, aluminum, copper or ceramic material, having a size of approximately 70 mm×70 mm. A pattern of an electrical conductor body such as aluminum or copper can be formed at various layer thicknesses and pattern widths. The conductor pattern can be formed, for example, by vapor depositing a conductor metal followed by selectively wet etching the deposited metal. A photolithographic process is preferably used in this wet etching. The interlayer insulator or layer-insulating film of the present invention, made of the described heat-resistant composition, can be applied at a film thickness of less than 40 $\mu$m.

In this connection, the pattern formation process of the present invention will be described with reference to FIGS. 3A to 3D and FIGS. 4A to 4C.

Figure 3A:
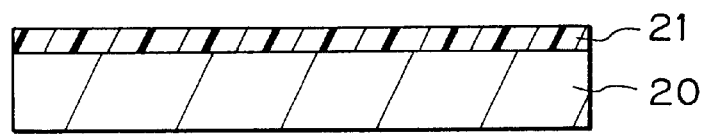
FIGS. 3A to 3D are cross-sectional views showing, in sequence, the pattern formation process of the present invention.
Figure 4A:
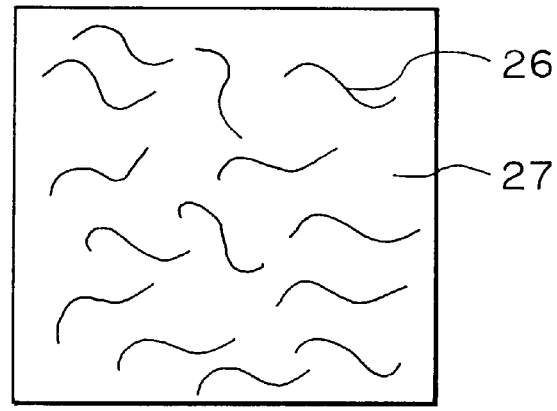
FIGS. 4A to 4C are schematic views showing, in sequence, the conversion of a polyimide precursor to a polyimide.

A photosensitive solution or resin composition of the present invention is spin-coated onto a Si wafer having a diameter of 3 in., and is then prebaked at 90° C. for 1 hr. As illustrated in FIG. 3A, a film 21 of the resin composition having a thickness of 5 $\mu$m is formed on the Si wafer 20. As shown in FIG. 4A, the film of the resin composition comprises the photopolymerizable monomer (or oligomer) 26 and polyimide precursor 27.

Figure 3B:
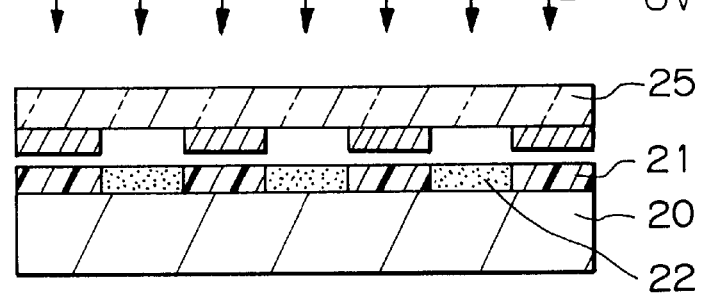
Figure 4B:
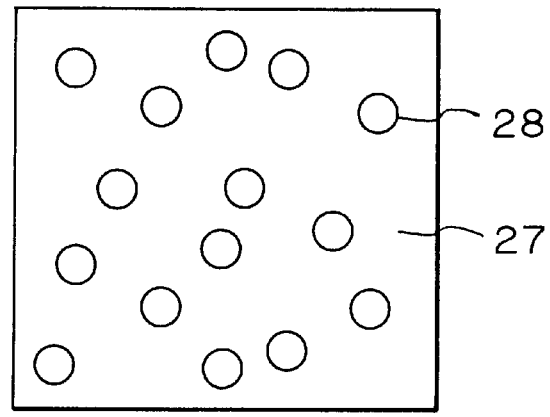

Next, as illustrated in FIG. 3B, a negative type glass mask 25 having a pattern width of 20 $\mu$m is disposed over the Si wafer 20, and the film 21 of the resin composition is exposed through the glass mask 25 to ultraviolet light having a wavelength of about 250 nm (or radiation having a wavelength of 250 to 400 nm from a Hg lamp) at an exposure level of 480 mJ/cm$^2$. As a result of this selective exposure, the unexposed areas of the film 21 remain unchanged, but the exposed areas 22 are changed because the photopolymerizable monomer is polymerized by the irradiation with ultraviolet light. Namely, as shown in FIG. 4B, the exposed areas 22 comprise polyimide precursor 27 and a polymerization product 28 of the monomer (or oligomer) in addition to unreacted monomer or oligomer (not shown).

Figure 3C:
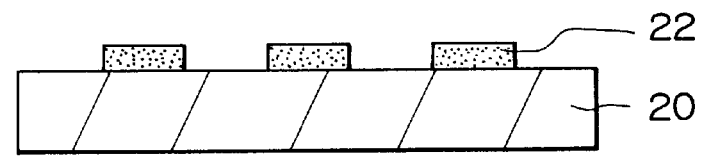

After selective exposure, the film 21 is developed with a solution of N-methyl-2-pyrrolidone using an ultrasonic development process. As illustrated in FIG. 3C, the exposed areas 22 remain on the wafer 20.

Figure 3D:
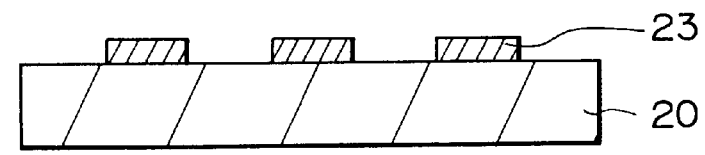
Figure 4C:
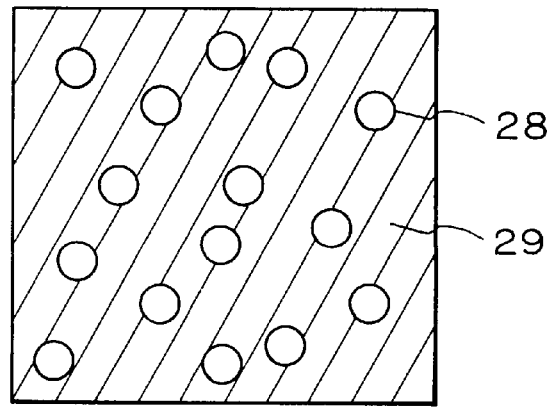

Finally, the wafer 20 is heated at 270° C. for 30 min (or at a suitable temperature of 250 to 350° C. for suitable time) to convert the polyimide precursor to polyimide. As illustrated in FIG. 3D, pattern 23 of the resulting polyimide resin is obtained on the wafer 20. The resulting polyimide resin is shown in FIG. 4C. Namely, the polyimide resin comprises the polymerization product 28 of the monomer (or oligomer) and polyimide 29. Note, FIGS. 4A to 4C are schematic views, and therefore the forms and proportions of the components 26, 27, 28 and 29 are illustrated to assist in the understanding of the conversion of polyimide precursor to polyimide resin.

It should be noted that FIG. 4C schematically clarifies the resulting polymerized film according to the invention, in which the polymerization product 28 formed by the polymerization reaction of a monomer or oligomer polymerizable by virtue of a polymerization initiator, is dispersed in a matrix of polyimide 29 formed by heating after the formation of the polymerized product 28. To attain this unique polymerized film, the polymerizable monomer or oligomer used in the invention is required to be capable of providing a high-heat-resistant polymer upon being polymerized so as to withstand a high temperature, such as 250 to 350° C., in the heat treatment for curing a polyimide precursor. The heat resistance of the polymer resulting from the polymerizable monomer or oligomer also provides the obtained film with a good heat resistance over a soldering temperature. The presence of the heat-resistant polymerization product 28 in the polyimide precursor before the heat treatment thereof effectively diminishes the reduction in film thickness during the heat treatment, as the polymerization product 28 is not lost through the heat treatment. In contrast, conventional polyimide-based compositions suffer from a considerable reduction of film thickness during a heat treatment because of the decomposition of photosensitive groups incorporated in a polyimide precursor and/or the loss of a substance in the composition, such as a polymerized material, by heating.

The conversion of polyimide precursor to polyimide resin is represented by the following reaction schema:

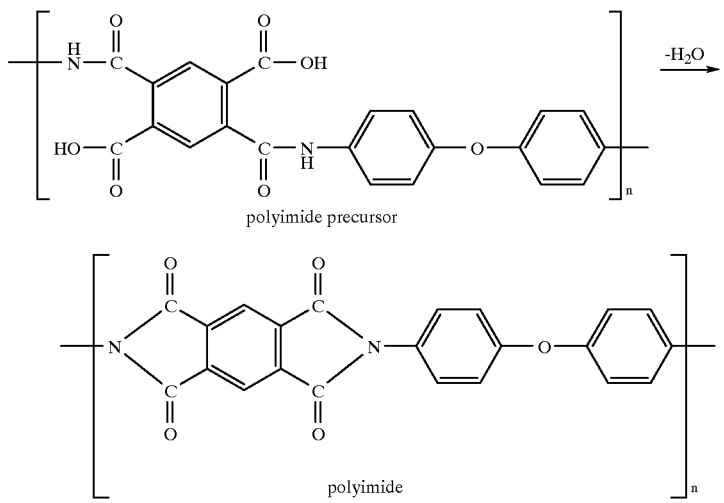

polyimide precursor polyimide

For a further understanding of the present invention, the photosensitive, heat-resistant resin composition according to the present invention and the formation of a pattern using the same will now be described by way of the following Examples.

The polymeric composite or polymer blend according to the present invention can be prepared in accordance with the following procedures:

(1) A tetracarboxylic acid dianhydride, aromatic diamine and polyhydric amine is mixed in an organic solvent, and the mixture is reacted to make a polyaddition reaction. An uniform solution of polyamic acid in an organic solvent is thus obtained.

(2) The thus obtained solution of polyamic acid is blended with an uncured curable resin, i.e., resin or resinous composition containing a reactive monomer or oligomer as a principal component thereof and, if necessary, a reaction initiator. Blending of the polyamic acid with the curable resin can be carried out by different methods, for example, by conducting a polyaddition reaction of the polyamic acid in a solution containing the previously added curable resin in an organic solution or, alternatively, by adding a curable resin to a solution of the polyamic acid in which the polyaddition reaction has been completed, but a gelation has not been completed.

(3) The blended solution of the polyamic acid and the curable resin is shaped to a film or other suitable shapes prior to curing of the resin. Preferably, the solution can be cast-coated over a substrate to form a film, or can be poured into a mold to form a molded product having a desired shape.

(4) Following the shaping procedure, an organic solvent is removed from a polymeric gel of the polyamic acid in which an organic solvent and an uncured curable resin are also contained. A desired islands-in-sea structure can be obtained by controlling the removal of the solvent.

(5) Following the curing reaction of the curable resin constituting the shaped article, the cyclodehydration reaction (dehydration and cyclization reaction) of the polyamic acid is completed to obtain a final product, i.e., shaped polymeric composite or polymer blend having an islands-in-sea structure.

The above procedures will be further described with reference to the details of the starting substances, production conditions and the like.

As mentioned above, a polyaddition reaction of the tetracarboxylic acid dianhydride, aromatic diamine and polyhydric amine is essential to the production of the polymeric composite according to the present invention. As will be appreciated, the above polyaddition reaction is a reaction between the tetracarboxylic acid dianhydride and amines, and accordingly it can be carried out by adding the tetracarboxylic acid dianhydride to a solution of the aromatic diamine and polyhydric amine in an organic solvent in an inert gas atmosphere such as nitrogen gas. The tetracarboxylic dianhydride used herein may be a solid or a liquid, i.e. solution thereof in a suitable solvent. Alternatively, both the aromatic diamine and the polyhydric amine may be added to the tetracarboxylic acid dianhydride.

In the practice of the present invention, a wide variety of tetracarboxylic acid dianhydrides can be used as a starting compound, and typical examples of suitable tetracarboxylic acid dianhydrides include pyromellitic acid dianhydride, 3,3',4,4'-benzophenone tetracarboxylic acid dianhydride, 3,3',4,4'-biphenyltetracarboxylic acid dianhydride, 2,3,3'4'-biphenyltetracarboxylic acid dianhydride, 2,2',3,3'-biphenyltetracarboxylic acid dianhydride, 2,2',6,6'-biphenyltetracarboxylic acid dianhydride, 2,3,6,7-naphthalene tetracarboxylic acid dianhydride, 1,2,5,6-naphthalene tetracarboxylic acid dianhydride, 2,2-bis(3,4-dicarboxylphenyl)propane dianhydride, bis(3,4-dicarboxylphenyl)sulfone dianhydride, bis(3,4-dicarboxylphenyl)ether dianhydride, 3,4,9,10-perylene tetracarboxylic acid dianhydride, naphthalene-1,2,4,5-tetracarboxylic acid dianhydride, naphthalene-1,4,58-tetracarboxylic acid dianhydride, benzene-1,2,3,4-tetracarboxylic acid dianhydride and ethyleneglucose bis (anhydrotrimellitate). These compounds may be used alone or as a mixture of two or more compounds.

Among the above-listed compounds, pyromellitic acid dianhydride, benzophenone tetracarboxylic acid dianhydride and biphenyltetracarboxylic acid dianhydride may be preferably used alone or in combination, because they enable to produce a polyimide composite having a high heat resistance and excellent mechanical properties.

Similarly, a wide variety of aromatic diamines can be used in combination with the tetracarboxylic acid dianhydride, and typical examples of suitable aromatic diamines include methaphenylene diamine, paraphenylene diamine, 4,4'-diaminodiphenyl propane, 4,4'-diaminodiphenyl methane, 3,3'-diaminodiphenyl methane, 4,4'-diaminodiphenyl sulfide, 4,4'-diaminodiphenyl sulfone, 3,3'-diaminodiphenyl sulfone, 3,4'-diaminodiphenyl sulfone, 4,4'-diaminodiphenyl ether, 3,3'-diaminodiphenyl ether, 3,4'-diaminodiphenyl ether, 4,4'-diaminobenzophenone, 3,3'-diaminobenzophenone, 2,2'-bis(4-aminophenyl)propane, benzidine, 3,3'-diaminobiphenyl, 2,6-diaminopyridine, 2,5-diaminopyridine, 3,4-diaminopyridine, bis[4-(4-aminophenoxy)phenyl]sulfone, bis[4-(3-aminophenoxy)phenyl]sulfone, bis[4-(4-aminophenoxy)phenyl]ether, bis[4-(3-aminophenoxy)phenyl]ether, 2,2'-bis[4-(4-aminophenoxy)phenyl]propane, 2,2'-bis[4-(3-aminophenoxy)phenyl]propane, 4,4'-bis(4-aminophenoxy)biphenyl, 1,4-bis(4-aminophenoxy)benzene, 1,3-bis(4-aminophenoxy)benzene, 2,2'-bis[4-(3-aminophenoxy)phenyl]hexafluoropropane, 1,5-diaminonaphthalene, 2,6-diaminonaphthalene and derivatives thereof. Also, dihydrazide compounds such as isophthalic acid dihydrazine can be used. These compounds may be used alone or as a mixture of two or more compounds.

Among the above-listed compounds, methaphenylene diamine, paraphenylene diamine, diaminodiphenyl methane and diaminodiphenyl ether may be preferably used alone or in combination, because they enable to produce a polyimide composite having a high heat resistance and excellent mechanical properties.

In addition, a polyhydric amine is used in combination with the tetracarboxylic acid dianhydride and the aromatic diamine. Note that the "polyhydric amine" used herein is intended to mean an amine compound containing at least three amines and/or ammonium bases in a molecular structure thereof.

A wide variety of polyhydric amines can be used along with other starting compounds, and typical examples of suitable polyhydric amines include 3,3',4,4'-tetraaminodiphenylether, 3,3',4,4'-tetraaminodiphenylmethane, 3,3',4,4'-tetraaminobenzophenone, 3,3'4,4'-tetraaminodiphenylsulfone, 3,3',4,4'-tetraaminobiphenyl, 1,2,4,5-tetraaminobenzene, 3,3',4'-triaminodiphenylether, 3,3',4-triaminodiphenylmethane, 3,3',4-triaminobenzophenone, 3,3',4-triaminodiphenylsulfone, 3,3'4-triaminobiphenyl, triaminobenzene and derivatives thereof. One example of useful derivatives includes polyhydric amine compounds in which one or more functional groups are substituted with a quaternary ammonium salt, for example, 3,3',4,4'-tetraaminobiphenyl.tetrahydrochloride. As a quaternary ammonium salt, sulfate or nitrate may be used in place of the hydrochloride. In these compounds in the form of a quaternary ammonium salt, all of the functional groups contained therein may not be substituted with a quaternary ammonium salt.

Further, it should be noted that the polyhydric amines may be in the form of a hydrate thereof, that polyhydric amines of aliphatic compounds may be used, if desired, and that the polyhydric amines may be used alone or as a mixture of two or more amines.

An organic solvent is used in the preparation of a polyamic acid which contains tetracarboxylic acid dianhydride, aromatic diamine and polyhydric amine as principal components thereof. The organic solvent used herein should be inert to the reaction of the polyamic acid and, at the same time, it should have a good solubility to the used monomers and the polymerization products thereof.

Typical examples of useful organic solvents include N,N-dimethylformamide, N,N-dimethylacetoamide, N,N-diethylformamide, N,N-diethylacetoamide, dimethylsulfoxide, N-methyl-2-pyrrolidone, N,N-dimethylmethoxyacetoamide, hexamethylphosphoamide, pyridine, dimethylsulfone, tetramethylenesulfone, phenols such as phenol, cresol and xylenol, benzene, toluene, xylene, benzonitril, dioxane, cyclohexane and the like. These organic solvents may be used alone or as a mixture of two or more solvents.

In the reaction of the above-mentioned compounds, a molar ratio of the tetracarboxylic acid dianhydride to the polyhydric amine can be widely varied, but preferably is in the range of 2 to 25 moles of the polyhydric amine per 100 moles of the tetracarboxylic acid dianhydride, more preferably in the range of 4 to 15 moles of the amine per 100 moles of the dihydrate. Note that the above-described preferred range may be slightly varied depending upon particulars of the used monomers, for example.

The polymeric composite of the present invention may include both the polymers and copolymers inclusive of terpolymers and the like, because as previously mentioned, each of the tetracarboxylic acid dianhydride, aromatic diamine and polyhydric amine may be used as a mixture of two or more compounds, if desired. Further, the polyamic acid used may be a blend of a first polymeric acid consisting of specific moieties and one or more second polymeric acids which are distinguished from the first polyamic acid in at least one moiety of the acid.

A curable, but not yet cured, resin is blended into the polyamic acid. The curable resin useful in the present invention is a resin or resinous composition which contains, at least, one or more reactive monomers and/or reactive oligomers which are soluble in an organic solvent, as a principal component thereof. Suitable curable resins include heat-curable resins, radiation-curable resins, electron beam (EB)-curable resins and the like, and they may be used alone or as a mixture of two or more resins. Preferably, uncured acrylic resins or phosphazenic resins can be used as the curable resin, and more preferably, reactive monomers and/or reactive oligomers containing at least two unsaturated double bonds can be used as the curable resin, because such monomers and oligomers can sometimes contain a reaction initiator or a curing accelerator in addition to the resin component.

Before blending the polymeric acid with the curable resin, the curable resin is dissolved in a suitable solvent. Typical examples of suitable solvents include amide solvents such as N,N-dimethylformamide and N,N-dimethylacetoamide, phenols such as cresol, phenol and xylenol, sulfone solvents such as dimethylsulfone, tetramethylenesulfone and dimethylsulfoxide, hydrocarbons such as benzene, toluene, xylene and cyclohexane, chlorinated solvents such as methylene chloride and dichloroethane, ketones, alcohols, N-methyl-2-pyrrolidone, benzonitril, pyridine, dioxane, polyphosphic acid, N,N-dimethylaniline and the like. These solvents may be used alone or in combination.

After completion of blending, a mixed solution of the polyamic acid and the curable resin (not yet cured) uniformly dissolved in an organic solvent is obtained.

Preferably, the thus obtained solution is coated over a substrate such as a silicon wafer by using any conventional coating means such as a spin coater, a roll coater or a dip coater. The coating is then kept to stand at about 30 to 200° C. to evaporate the solvent from the coating. As a result of evaporation of the solvent, a phase separation occurs in the coating, thus producing an islands-in-sea structure. While retaining the same structure, the uncured curable resin as an islands component is first cured, and then the polyamic acid as a sea component is polymerized to accomplish a cyclodehydration reaction thereof. A polymeric composite or polymer blend having an islands-in-sea component is thus obtained.

The formation and distribution of the islands-in-sea structure were clarified, after the inventors have conducted an analysis of the components of the produced polymeric composite. Further, it was clarified that during evaporation of the solvent, a particle size of the resulting islands (curable resin) can be reduced with the time of evaporation, and also the resulting particle size of the islands can be adjusted to a desired value.

Preferably, evaporation of the solvent can be accomplished by heating a mixed solution after coating thereof. In the coating of the mixed solution, a compatibility between the uniformly dissolved polyamic acid and the uncured curable resin is reduced with evaporation or drying of the solvent, and accordingly an islands-in-sea structure inherent to the mixed resin (polymer blend) grows as a function of the reduction of such compatibility. At the growth stage of the islands-in-sea structure, the curable resin has a softness, while the polyamic acid tends to form the corresponding imide, because a volume of the polyamic acid occupied in the coating of the solution is reduced with evaporation of the solvent, and as a result, the curable resin and the polyamic acid form islands and sea, respectively. Further, the reduction in the occupying volume of the polyamic acid in the coating is effective to produce finely divided islands, because the soft curable resin is gradually compressed as a function of the reduced volume of the polyamic acid. Note, however, that the reduction in the particle size of the islands can be inhibited upon curing of the resin of the islands with, for example, application of radiations or heat during evaporation of the solvent, and further heating does not cause a further reduction of the particle size of the islands, while it can accelerate an imide formation from the polyamic acid.

The above-described solvent contained in the polyamic acid, if it is evaporated with gradual heating at a temperature lower than a boiling point thereof, can cause a phase separation in the coating as a result of deposition of the curable resin, because the temporarily dissolved resin cannot maintain its dissolution state in the heated solvent. To obtain a satisfactory phase separation, it is preferred that heating is carried out at 30 to 200° C. for 5 minutes to 3 hours, while the temperature and time of heating can be varied depending upon various factors such as particulars of the used solvent including boiling point and the thickness of the coating.

Figure 7A:
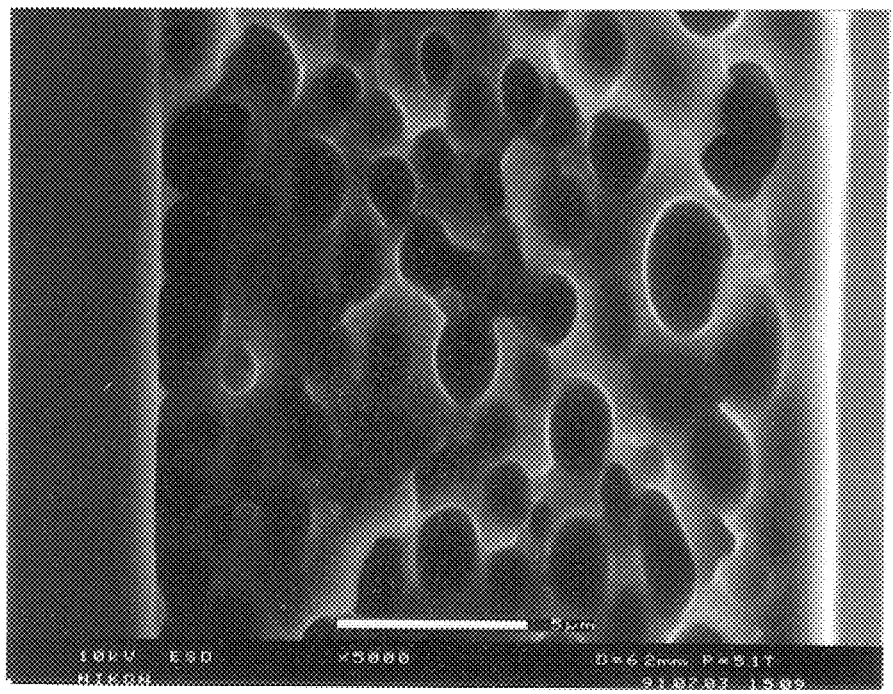
FIGS. 7A and 7B each is a scanning electron micrograph (SEM) showing a cross-section of the particles-in-matrix microstructure according to the present invention.
Figure 7B:
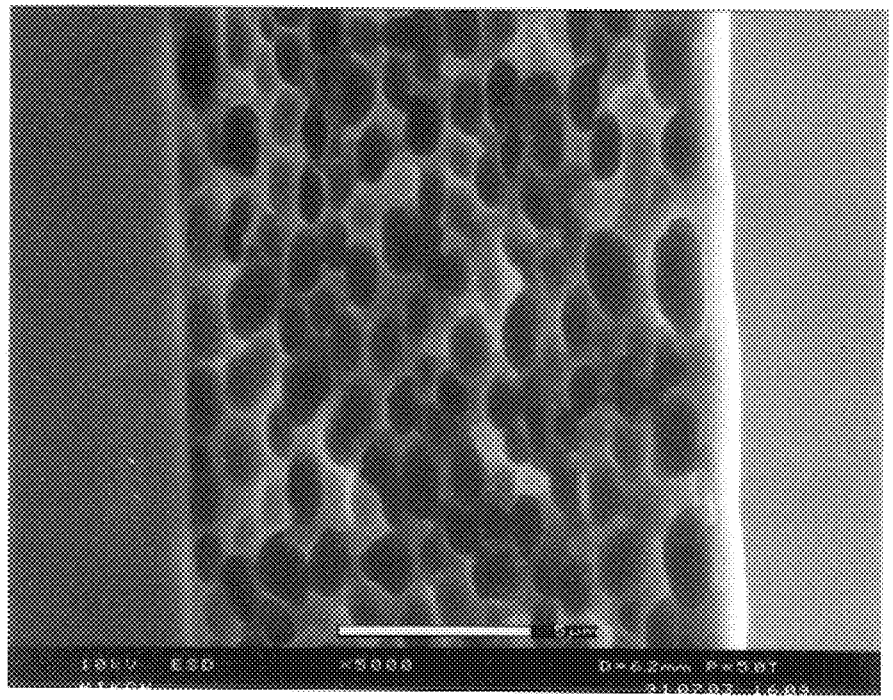

The effects of heating onto the particle size of the resulting islands will be appreciated from FIGS. 7A and 7B which are scanning electron micrographs (SEM) of the islands-in-sea structure according to the present invention. The structure of FIG. 7A was obtained after a coating of the polyamic acid and the acrylic monomer was heated at 60° C. for 60 minutes, and that of FIG. 7B was obtained after heating of the coating at 120° C. for 60 minutes. Comparing the polyamic acid (polyimide) as a sea component and the acrylic monomer as an islands component of FIG. 7A with those of FIG. 7B, it is observed that the temperature of 120° C. is effective to reduce a particle size of the islands in comparison with the temperature of 60° C.

Using the polymeric composite, especially a film of the polymeric composite, according to the present invention, it becomes possible to produce a film having a lower stress than the film of conventional polyimides, because a reduction of the volume of the polyimide, i.e. inherent drawback during formation of polyimide, can be moderated. Further, as is farther evidenced in the appended working examples, it becomes possible to provide fine depressions and projections on a surface of the film, because if washing (namely, developing) of the film with any suitable solvent capable of dissolving the polyamic acid is carried out prior to completion of the formation of polyimide from the polyamic acid, the polyamic acid can be eluted from the top surface portion of the film. The depressions and projections in the film surface have an anchor effect, and accordingly can improve a fixability of any film to the underlying film of the polymeric composite.

Figure 8A:
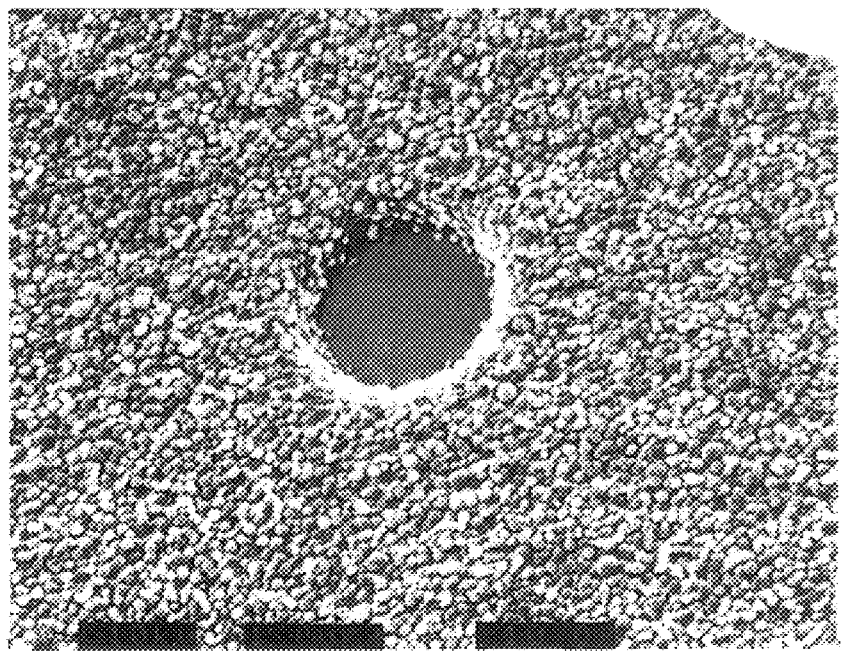
FIGS. 8A and 8B each is a SEM showing a roughened surface of the polymeric composite film according to the present invention.
Figure 8B:
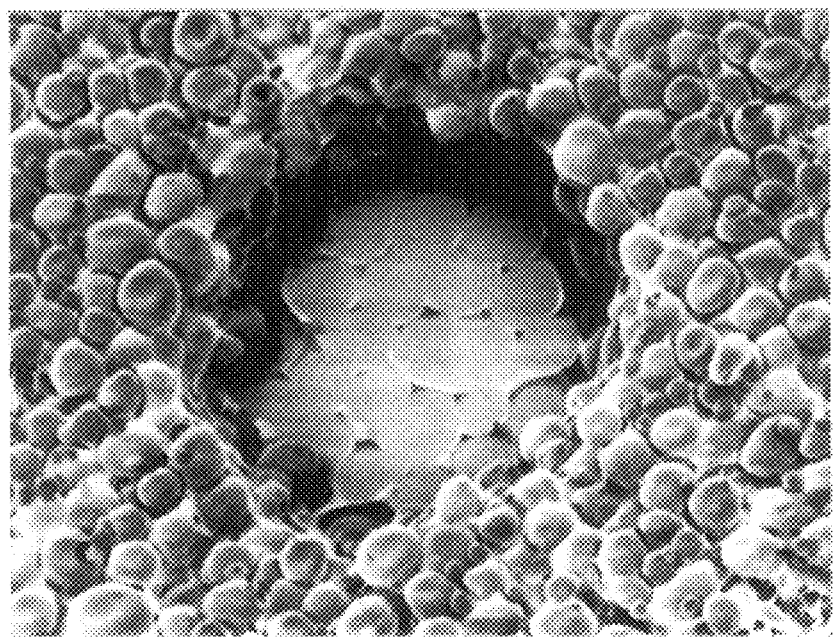

FIGS. 8A and 8B are the SEMs showing a roughened surface of the polymeric composite film according to the present invention, and they evidence that islands of the acrylic resin are exposed in the surface of the film. Note that the acrylic islands in FIG. 8B have an increased particle size compared to that of FIG. 8A, because a ratio of the amount of the used acrylic monomer between the film of FIG. 8A and that of FIG. 8B is 1:2.

Figure 9:
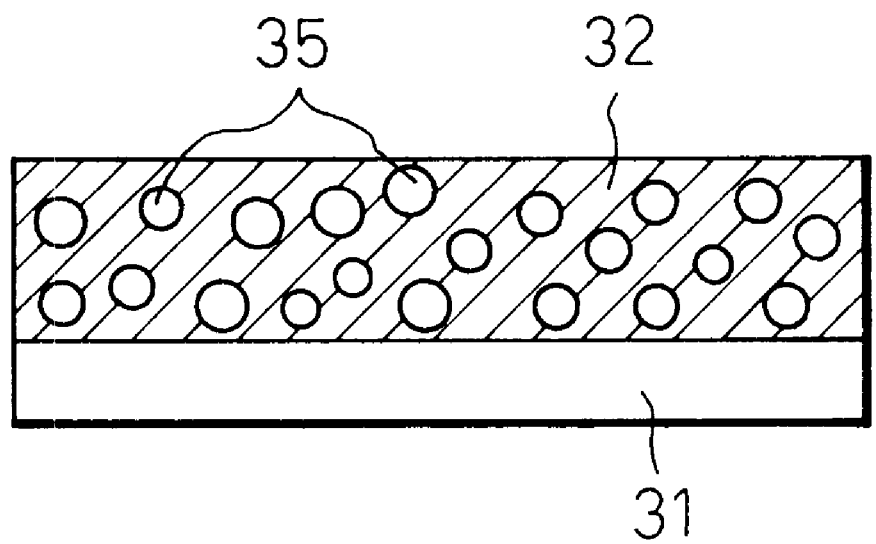
FIG. 9 is a cross-sectional view of the substrate having applied thereon the polymeric composite film according to the present invention.

In addition, as a result of study of the relaxation of stress of the polyimide resin which shows a large variation of the volume (i.e. cause of stress) as a function of shrinkage upon curing, the inventors have found that satisfactory results can be obtained, if the particles having less dependency of the volume variation upon heat are dispersed in a film. FIG. 9 illustrates the dispersion of fine particles 35 in a film 32 of the polyimide resin on a substrate 31.

More particularly, some methods are suggested to disperse fine particles in a film of the polyimide resin. First, suitable fine particles showing less variation of volume upon heat include organic particles such as finely divided particles of an acrylic resin or a phosphazenic resin. These organic particles may be used alone or as a mixture of two or more particles and, alternatively, they may be used in combination with one or more of suitable inorganic particles. Of course, one or more of suitable inorganic particles may be used without combining with the organic particles, if necessary. Combined used of different particles are preferred in view of the notable effects thereof.

Second, the uniform dispersion of the fine organic or inorganic particles in the polyimide film can be advantageously attained by previously providing suitable particles such as acrylic or phosphazenic particles, dispersing the particles in a varnish of polyimide precursor, coating the dispersion over a substrate, and then polymerizing the polyimide precursor in the coated film to form a polyimide film having uniformly dispersed therein the particles. To uniformly disperse the particles in the varnish, any suitable means such as rapid agitation in a homomixer or ultrasonic dispersion may be used, if desired. Alternatively, after the particles have been previously dispersed in a suitable solvent, the resulting suspension may be mixed with the varnish of polyimide precursor.

In connection with the above descriptions, it is also suggested that an acrylic or phosphazenic monomer is dissolved in a varnish of polyimide precursor, the solution is coated over a substrate, and then the coated film is dried to evaporate a solvent of the varnish from the film. Drying of the film produces an islands-in-sea structure comprising a polyimide precursor as a sea component and an acrylic or phosphazenic monomer as an islands component, as a result of microscopic phase separation caused due to said evaporation of the solvent. Following the formation of the islands-in-sea structure, heating or irradiation of radiations is carried out to cause a polymerization (i.e., curing) of the acrylic or phosphazenic monomer as the islands component. Finally, a film of the polyimide resin (matrix) having dispersed therein fine particles of acrylic or phosphazenic polymer is produced.

The polyimide film used in the above-mentioned embodiment of the present invention may include any conventional polyimide films, in addition to the polyimide film discussed above with reference to the polymeric composite. For example, a polyimide film can be produced by reacting a selective combination of tetracarboxylic acid and diamine in a polar solvent to prepare a varnish of polyimide precursor, coating the varnish over a substrate and then heating the coated film at the range of 200 to 400° C. to thereby cause a dehydration and condensation reaction of the polyimide precursor.

A wide variety of conventional polyimide films can be advantageously used in the above embodiment, and typical examples of suitable polyimide include those prepared from pyromellitic acid dianhydride and 4,4'-diaminodiphenylether, those from 3,3',4,4'-benzophenone tetracarboxylic acid dianhydride and 4,4'-diaminodiphenylether, those from 3,3',4,4'-biphenyl tetracarboxylic acid dianhydride and 4,4'-diaminodiphenylether, those from pyromellitic acid dianhydride and paraphenylenediamine, those from 3,3',4,4'-biphenyl tetracarboxylic acid dianhydride and paraphenylene diamine, and those from bis(3-aminopropyl)tetramethyldisiloxane. Note, however, that the present invention should not be restricted to the exemplified polyimides.

In the practice of the present invention, a particle size of the fine particles used in the above embodiment is not restricted, however, it is preferably of 5 μm or less, more preferably 2 μm or less. If it is desired to obtain an even thin film of the polymeric composite, it is contemplated to use fine particles having the reduced particle size. The shape of the particles is also not restricted, and for example, spherical or flaky particles may be used with satisfactory results.

As above described, the inventors have found that the fine particles-dispersed polyimide film can exhibit a relaxed stress comparing to the similar polyimide film having no dispersed particles, even if the polyimide is produced from a precursor thereof, a formation of polyimide is induced with application of heat, along with formation of byproducts, and the film is heated to evaporate a solvent therefrom. The reason why the surprisingly excellent results can be obtained in the polyimide film having the dispersed particles resides in the facts that the dispersed particles can act to inhibit a shrinkage of the volume of the polyimide and also to relax a stress generated in the film.

The relaxation of stress is explained as follows. If the particles are added to a varnish of polyimide precursor in a ratio of the particles to the resin of the varnish of 1:1, a stress to light-insensitive polyimide is reduced to 70% or less, and a stress to light-sensitive polyimide to 60% or less, respectively. This means that warpage of wafers and disconnection of wirings in thin layer multilevel circuits can be effectively prevented by using the polymeric composite having the dispersed particles.

Generally, prior art light-sensitive polyimides exhibit a stress of 40 MPa or more, and prior art light-insensitive polyimides a stress of 35 MPa or more, respectively. Accordingly, if these polyimides are intended to be used as a protective film or interlayer insulator in high density-mounting printed circuits, printed boards, wiring boards or electronic devices, it is essential to use two or more polyimide films, each having a thickness of 10 to 20 μm, as a laminate of the films, thus causing warpage of the wafers having a thickness of about 500 μm, and also frequently causing disconnection of wirings. In contrast, according to the present invention, such defects can be prevented, because the stress in the order of 25 MPa can be inhibited while retaining excellent characteristics of polyimide.

EXAMPLE 1

In this Example, the use of various polyimide precursors is described.

| | |
|---|---|
| Varnish of polyimide precursor: (precursor content of varnish: 14.5% by weight) | 50.0 g; |
| Photopolymerizable monomer: [tris (acryloyloxyethyl) isocyanurate] | 10.0 g; |
| Photopolymerization initiator: benzophenone | 1.0 g. |

Varnishes of a polyimide precursor and of a polybismaleimide precursor, each having a precursor content of 14.5% by weight, were prepared, and the precursors were compared using the same monomer and photopolymerization initiator.

A photosensitive solution having the above-described composition was spin-coated onto a pretreated Si wafer having a diameter of 3 in., and the coated wafer was then prebaked at 90° C. for 1 hr. The thickness of the film after prebaking was 5 μm.

A negative type glass mask having a minimum pattern width of 30 μm was placed on the photosensitive plate and the coated and masked plate was irradiated with ultraviolet light having a wavelength of 250 nm under exposure conditions of 480 mJ/cm$^2$.

Then, the photosensitive plate was subjected to ultrasonic wave development using N-methyl-2-pyrrolidone, and was then rinsed in ethyl alcohol, thereby developing the plate. The unexposed regions were eluted or dissolved while leaving the exposed pattern regions only on the wafer.

The plate was then heated at 270° C. for 30 min to convert the residual polyimide precursor into a polyimide resin. As a result, although the yellow coloration of the pattern region increased slightly, no other changes were observed.

The pattern was observed under a microscope, and no breakage was found in any sample. The thermal decomposition temperature of the resin in the pattern region was measured, and it was found that the resins were stable up to about 350° C., regardless of the type of varnish used as the precursor.

EXAMPLE 2

In this Example, the use of various photopolymerizable monomers is described.

An experiment was conducted in the same manner as that of Example 1, except that varnishes of the polyimide precursor and the photopolymerization initiator as described in Example 1 were used with four different photopolymerizable monomers as given below, and the photosensitive plates were irradiated with ultraviolet light having a wavelength of 250 nm under suitable exposure conditions.

The photopolymerizable monomers are listed and the exposure and thermal decomposition temperatures are given in Table 1. The identities and amounts of addition of the photopolymerizable monomers are referred to by Nos. 1 to 5 below (No. 1 is the same material as that used in Example 1).

No. 1: tris(acryloyloxyethyl)isocyanurate (amount of addition: 10 g)
No. 2: glycidyl acrylate (amount of addition: 5 g)
No. 3: pentaerythritol triacrylate (amount of addition: 20 g)

No. 4: dipentaerythritol hexaacrylate (amount of addition: 15 g)

No. 5: mixture of tris(acryloyloxyethyl)isocyanurate (amount of addition: 6 g) with trimethylolpropane triacrylate (amount of addition: 4 g)

The patterns were observed under a microscope, and no breakage was found in any sample. The thermal decomposition temperatures of the resins in the pattern regions were measured, and as a result, the heat resistance was determined to be 280 to 400° C. in terms of the thermal decomposition temperature.

TABLE 1

| Photopolymerizable monomer | Exposure (mJ/cm$^2$) | Decomposition temp. (° C.) |
| --- | --- | --- |
| No. 1 | 480 | 350 |
| No. 2 | 960 | 400 |
| No. 3 | 400 | 280 |
| No. 4 | 640 | 300 |
| No. 5 | 560 | 320 |

EXAMPLE 3

In this Example, various photopolymerization initiators are examined.

An experiment was conducted in the same manner as that of Example 1, except that varnishes of the polyimide precursor and the photopolymerizable initiator as described in Example 1 were used with six different photopolymerization initiators as given below and the photosensitive plates were irradiated with ultraviolet light having a wavelength of 250 nm under suitable exposure conditions.

The photopolymerization initiators are listed and the exposure conditions necessary for the formation of a pattern are given in Table 2. The identities and amounts of addition of the photopolymerization initiators are referred to by Nos. 1 to 6 below (No. 1 is benzophenone, i.e., the same material as that used in Example 1).

No. 1: benzophenone (amount of addition: 1.0 g)

No. 2: 3,3'-4,4'-tetra-(tert-butylperoxycarbonyl) benzophenone (amount of addition: 0.80 g)

No. 3: isopropyl benzoin ether (amount of addition: 2.0 g)

No. 4: 2-hydroxy-methyl-propiophenone (amount of addition: 0.50 g)

No. 5: 2-methylthioxanthone (amount of addition: 0.20 g)

No. 6: 2,4-bis(trichloromethyl)-6-phenyl-1,3,5-triazine (amount of addition: 1.50 g)

The patterns were observed under a microscope, and no breakage was found in any sample.

The following results were obtained when the development was conducted under the same developing conditions as described above in Example 1, and the results are not equal to the sensitivities of the respective photopolymerization initiators. Therefore, it has been found that the sensitivity of the composition varies with the amount of the photopolymerization initiator therein and with the developing conditions.

TABLE 2

| Photopolymerization initiator | Exposure (mJ/cm$^2$) |
| --- | --- |
| No. 1 | 480 |
| No. 2 | 400 |
| No. 3 | 400 |
| No. 4 | 800 |
| No. 5 | 1,280 |
| No. 6 | 560 |

EXAMPLE 4

In this Example, the use of a modified polyimide precursor is described.

| | |
| --- | --- |
| Varnish of polyimide precursor: silicone-modified polyimide (precursor content of varnish: 13.5% by weight) | 50.0 g; |
| Photopolymerizable monomer: pentaerythritol tetraacrylate | 12.0 g; |
| Photopolymerization initiator: benzoyl peroxide | 2.0 g. | composition was spin-coated onto a pretreated Si wafer having a diameter of 3 in., and the coated wafer was prebaked at 120° C. for 1 hr. The thickness of the film after prebaking was 6 µm.

A negative type glass mask having a minimum pattern width of 30 µm was placed on the photosensitive plate and the coated and masked wafer was irradiated with light from a high-pressure mercury lamp for 20 sec.

Then, the photosensitive plate was subjected to ultrasonic wave development using a mixed solution comprising N-methyl-2-pyrrolidone and methyl cellosolve, and thereafter the plate was rinsed in isopropyl alcohol, thereby developing the plate. The unexposed regions were eluted while the exposed pattern regions only were left on the plate.

The plate was then heated at 300° C. for 30 min to convert the residual polyimide precursor into a polyimide resin, and as a result, although the yellow coloration of the pattern region was increased slightly, no other changes were observed.

The pattern was observed under a microscope, and no breakage was found in any sample. The thermal decomposition temperature of the resin in the pattern region was measured, and it was found that the resin was stable up to about 300° C.

EXAMPLE 5

| | |
| --- | --- |
| Varnish of polyimide precursor: polyimide precursor (14.5% by weight) | 50.0 g; |
| Phosphazene monomer: HEMA6-substituted 3PNC (3PNC in which each of six (6) Chlorine substituents is substituted with 2-hydroxethyl methacrylate) | 10.0 g; |
| Photopolymerization initiator: 2,2-dimethoxy-2-phenylacetophenone | 1.00 g; |
| Solvent: methyl ethyl ketone | 10.0 g. |

A photosensitive solution having the above-described composition was spin-coated onto a pretreated Si wafer having a diameter of 3 in., and the coated wafer was prebaked at 90° C. for 1 hr. The thickness of the film after prebaking was 3 µm.

A negative type glass mask having a minimum pattern width of 30 µm was placed on the photosensitive plate and the coated and masked plate was irradiated with an ultraviolet light from a high-pressure mercury lamp (wavelength:

250–400 nm) at exposure conditions of 500 mJ/cm² (in terms of a wavelength of 365 nm).

Then, the photosensitive plate was subjected to ultrasonic wave development using N-methyl-2-pyrrolidone, and then the plate was rinsed in ethyl alcohol, thereby developing the plate. The unexposed regions were eluted while the exposed pattern regions only were left on the plate.

The pattern regions were then heated at 260° C. for 30 min to convert the residual polyimide precursor into a polyimide resin, and as a result, although the yellow coloration of the pattern region increased slightly, no other changes were observed.

The pattern was observed under a microscope, and no breakage was found. The thermal decomposition temperature of the resin in the pattern regions was measured, and the resin was found to be stable up to about 350° C.

EXAMPLE 6 to 8

Patterns were formed in the manner described above in Example 5, except that HEA6-substituted 3PNC (3PNC in which each of six Cl substituents is substituted with 2-hydroxyethyl acrylate), a mixture of HEMA6-substituted 3PNC with trimethylolpropane triacrylate or a mixture of HEMA6-substituted 3PNC with pentaerythritol triacrylate and isocyanuric acid EO-modified (n=3) triacrylate was used instead of the HEMA6-substituted 3PNC used in Example 5. The appearance of the patterns were observed under a microscope, and no abnormal portions were found. The thermal decomposition temperature of the resin in each pattern region was measured. The results are given in the following Table 3.

TABLE 3

| Ex.No. | Monomer | Exposure (mJ/cm²) | Thermal decomposition temp. (° C.) |
|---|---|---|---|
| 5 | HEMA6-substituted 3PNC (10.0 g) | 500 | 350 |
| 6 | HEMA6-substituted 3PNC | 750 | 400 |
| 7 | HEMA6-substituted 3PNC (8.0 g) + trimethylolpropane triacrylate (4.0 g) | 350 | 330 |
| 8 | HEMA6-substituted 3PNC (5.0 g) + pentaerythritol triacrylate (5.0 g) + isocyanuric acid EO-modified (n = 3) triacrylate (5.0 g) | 400 | 360 |

EXAMPLE 9 to 13

Exposure conditions suitable for the formation of patterns were examined in the same manner as described above in Example 5, except that 3,3'-4,4'-tetra-(tert-butylperoxycarbonyl)benzophenone, isopropyl benzoin ether, 2-hydroxy-2-methyl-propiophenone, 2-methylthioxanthone or 2,4-bis(trichloromethyl)-6-phenyl-1,3,5-triazine was used as the initiator instead of 2,2-dimethoxy-2-phenylacetophenone. The results are given in Table 4. These results were obtained by conducting the development using the same developing conditions as described above in Example 5 and the results are not completely equal to the sensitivities of the respective photopolymerization initiators. It also has been found that the sensitivity of the composition varies with the amount of the photopolymerization initiator therein and with the developing conditions.

TABLE 4

| Ex.No. | Photopolymerization initiator | | Exposure (mJ/cm²) |
|---|---|---|---|
| 5 | 2,2-dimethoxy-2-phenylacetophenone | (1.00 g) | 500 |
| 9 | 3,3'-4,4'-tetra-(tert-butylperoxycarbonyl) benzophenone | (0.80 g) | 250 |
| 10 | isopropyl benzoin ether | (2.00 g) | 400 |
| 11 | 2-hydroxy-2-methyl-propiophenone | (0.50 g) | 800 |
| 12 | 2-methylthioxanthone | (0.20 g) | 1,000 |
| 13 | 2,4-bis(trichloromethyl)-6-phenyl-1,3,5-trizaine | (1.50 g) | 350 |

EXAMPLE 14

| | |
|---|---|
| Varnish of silicone-modified polyimide precursor: silicone-modified polyimide precursor (13.5% by weight) | 50.0 g; |
| Phophazene monomer: HEA6-substituted 3PNC (3PNC in which each of six Cl substituents is substituted with 2-hydroxyethyl acrylate) | 12.0 g; |
| Photopolymerization initiator: benzoyl peroxide | 2.00 g. |

A photosensitive solution having the above-described composition was spin-coated onto a glass substrate having a size of 70×70×1 mm, and the coated substrate was prebaked at 120° C. for 1 hr. The thickness of the film after prebaking was 5 μm.

A negative type glass mask having a minimum pattern width of 30 μm was placed on the photosensitive plate and the coated and masked plate was irradiated with light from a high-pressure mercury lamp for 60 sec.

Then, the photosensitive plate was subjected to ultrasonic wave development using a mixed solution comprising N-methyl-2-pyrrolidone and methyl cellosolve and then the plate was rinsed in isopropyl alcohol, thereby developing the plate. The unexposed regions were eluted while the exposed pattern regions only were left on the plate.

The pattern regions were then heated at 250° C. for 50 min to convert the residual polyimide precursor into a polyimide resin, and as a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 300° C.

EXAMPLE 15

Varnish of polyimide precursor: polyimide precursor (14.5% by weight) 50.0 g;

Acrylic oligomer: oligomer 1 represented by the following formula 10.0 g,

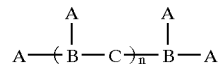

wherein

A: acrylic acid

B: 2-ethyl-2-hydroxymethyl-1,3-propanediol

C: 3-cyclohexene-1,2-dicarboxylic acid

:4-cyclohexene-1,2-dicarboxylic acid;

Photopolymerization initiator: 2,2-dimethoxy-2-phenylacetophenone 1.00 g.

A photosensitive solution having the above-described composition was spin-coated onto a silicon wafer having a diameter of 3 in., and the coated wafer was prebaked at 120° C. for 1 hr. The thickness of the film after the prebaking was 9 μm.

A negative type glass mask having a minimum pattern width of 30 μm was placed on the photosensitive plate and the coated and masked plate was irradiated with ultraviolet light by means of an ultraviolet exposing machine at an exposure of 600 mJ/cm² (365 nm).

The photosensitive plate was subjected to ultrasonic wave development with N-methyl-2-pyrrolidone and then the plate was rinsed in ethyl alcohol, thereby developing the plate. The unexposed regions were eluted while the exposed pattern regions only were left on the plate.

The pattern regions were then heated at 300° C. for 30 min to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 350° C.

EXAMPLE 16 to 20

Patterns were formed in the same manner as described above in Example 15, except that the following oligomer 2, oligomer 3, mixture of oligomer 1 with pentaerythritol triacrylate, mixture of oligomer 2 with trimethylolpropane triacrylate and mixture of oligomer 3 with isocyanuric acid EO-modified (n=3)triacrylate were used instead of the acrylic oligomer 1 used in Example 15. The various patterns were observed under a microscope, and no breakage was found. The thermal decomposition temperatures of the resins in the pattern region were measured. The results are given in Table 5. Oigomers 2 and 3 are as follows:

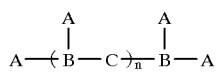

wherein

A: methacrylic acid

B: 2-ethyl-2-hydroxymethyl-1,3-propanediol

C: 4-cyclohexene-1,2-dicarboxylic acid.

Acrylic oligomer 3:

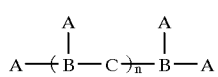

wherein

A: acrylic acid

B: 2-ethyl-2-hydroxymethyl-1,3-propanediol :pentaerythritol

C: 3-cyclohexene-1,2-dicarboxylic acid
: 4-cyclohexene-1,2-dicarboxylic acid.

TABLE 5

| Ex.No. | Oligomer | | Exposure (mJ/cm²) | Thermal decomposition temp. (° C.) |
|---|---|---|---|---|
| 15 | oligomer 1 | (10.0 g) | 600 | 350 |
| 16 | oligomer 2 | (5.0 g) | 960 | 400 |
| 17 | oligomer 3 | (15.0 g) | 600 | 330 |
| 18 | oligomer 1 + pentaerthritol triacrylate | (6.0 g) (6.0 g) | 720 | 300 |
| 19 | oligomer 2 + trimethylolpropane triacrylate | (6.0 g) (4.0 g) | 840 | 360 |
| 20 | oligomer 3 + isocyanuric acid EO-modified (n = 3) triacrylate | (5.0 g) (8.0 g) | 800 | 340 |

EXAMPLE 21 to 29

Exposure conditions necessary for the formation of patterns were determined in the same manner as described in Example 15, except that 3,3'-4,4'-tetra-(tert-butylperoxycarbonyl)benzophenone, isobutyl benzoin ether, benzyl methyl ketal, 2-methylthioxanthone, 2,4,6-tris(trichloromethyl)-1,3,5-triazine, benzoyl peroxide, 2,4-bis(trichloromethyl)-6-phenyl-1,3,5-trizaine, ($\eta^6$-benzene) ($\eta^5$-cyclopentadienyl) (II) hexafluorophosphate and N-phenylglycine were used as the initiator instead of 2,2-dimethoxy-2-phenylacetophenone as was used in Example 15. The results are given in Table 6. These results were obtained by conducting the development using the same developing conditions as were used in Example 15 and the results are not completely equal to the sensitivities of the respective photopolymerization initiators. It also has been found that the sensitivity of the composition varies with the amount of the photopolymerization initiator therein and the developing conditions.

TABLE 6

| Ex.No. | Photopolymerization initiator | | Exposure (mJ/cm²) |
|---|---|---|---|
| 15 | 2,2-dimethoxy-2-phenylacetophenone | (1.00 g) | 600 |
| 21 | 3,3'-4,4'-tetra-(tert-butylperoxy-carbonyl) benzophenone | (0.80 g) | 540 |
| 22 | isopropyl benzoin ether | (2.00 g) | 840 |
| 23 | benzyl dimethyl ketal | (0.50 g) | 960 |
| 24 | 2-methylthioxanthone | (0.20 g) | 1,200 |
| 25 | 2,4,6-tris(trichloromethyl)-1,3,5-triazine | (1.50 g) | 720 |
| 26 | benzoyl peroxide | (1.50 g) | 840 |
| 27 | 2,4-bis(trichloromethyl)-6-phenyl-1,3,5-triazine | (0.50 g) | 1,200 |
| 28 | ($\eta^6$-benzene) ($\eta^5$-cyclopentadienyl) (II) hexafluorophosphate | (2.00 g) | 720 |
| 29 | N-phenylglycine | (1.80 g) | 840 |

EXAMPLE 30

| | |
|---|---|
| Varnish of silicone-modified polyimide precursor: silicone-modified polyimide precursor (13.5.% by weight) | 50.0 g; |
| Acrylic oligomer: oligomer 1 | 5.0 g; |
| Monomer isocyanuric acid EO (n = 3) · ε-caprolactone modified triacrylate | 5.0 g; |
| Photopolymerization initiator: 2-hydroxy-2-methyl-propiophenone | 1.50 g. |

A photosensitive solution having the above-described composition was spin-coated onto a pretreated Si wafer having a diameter of 3 in., and the coated wafer was prebaked at 100° C. for 1 hr. The thickness of the film after prebaking was 8 μm.

A negative type glass mask having a minimum pattern width of 30 μm was placed on the photosensitive plate and the coated and masked plate was irradiated with light from a high-pressure mercury lamp for 40 sec.

Then, the photosensitive plate was subjected to ultrasonic wave development using a mixed solution comprising N-methyl-2-pyrrolidone and methyl celloslove and the plate was then rinsed in isopropyl alcohol, thereby developing the plate. The unexposed regions were eluted while the exposed pattern regions only were left on the plate.

The pattern regions were then heated at 280° C. for 30 min to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern regions was measured, and as a result, the resin was found to be stable up to about 330° C.

EXAMPLE 31

Viaholes were formed using a photosensitive solution having the same composition as that of Example 30 and using the same procedure as in Example 30, except that a pretreated ceramic substrate (Al$_2$O$_3$) having a bell size, a pretreated glass substrate having a size of 70×70×1 mm, a pretreated aluminum plate having a size of 70×70×2 mm and a pretreated copper plate having a size of 70×70×1 mm were used instead of the 3 in. diameter Si wafer. Use was made of a negative type glass mask having a minimum viahole size of 50 μmφ. By observation under a microscope after curing, it has been found that via-holes having a size up to 50 μmφ were formed.

EXAMPLE 32

A resin composition containing a dimeric imidazole compound initiator was prepared which had the following composition:

Varnish of polyimide precursor: polyimide precursor (17.5% by weight) 50.0 g;

Acrylic oligomer: oligomer 4 represented by the following formula 10.0 g,

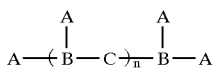

wherein
A: acrylic acid
B: 2-ethyl-2-hydroxymethyl-1,3-propanediol
C: 3-cyclohexene-1,2-dicarboxylic acid
: 4-cyclohexene-1,2-dicarboxylic acid;
Photopolymerization initiator: 2,2'-bis(o-chlorophenyl)-4,4',5,5'-tetraphenyl-1,2'-diimidazole 1.00 g.

A photosensitive solution having the above-described composition was spin-coated onto a silicon wafer having a diameter of 3 in., and the coated wafer was prebaked at 120° C. for 1 hour. The thickness of the film after the prebaking was 20 μm.

A negative type glass mask having a minimum pattern width of 30 μm was placed over the photosensitive plate and the coated and masked plate was irradiated with ultraviolet light by means of an ultraviolet exposing machine at an exposure of 250 mJ/cm$^2$ (365 nm).

The photosensitive plate was subjected to ultrasonic wave development with N-methyl-2-pyrrolidone and then the plate was rinsed in ethyl alcohol, thereby developing the plate. The unexposed regions were eluted while the exposed pattern regions only were left on the plate.

The pattern regions were then heated at 300° C. for 30 min. to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 350° C.

EXAMPLE 33 to 37

Patterns were formed in the same manner as described in Example 32, except that the following oligomer 5, oligomer 6, mixture of oligomer 5 with trimethylolpropane triacrylate, isocyanuric acid EO-modified (n=3) triacrylate, and pentaerythritol triacrylate were used instead of the acrylic oligomer 4 used in the above-described Example 32. The various patterns were observed under a microscope, and no breakage was found. The thermal decomposition temperatures of the resins in the pattern region were measured. The results are given in Table 7. Oigomers 5 and 6 are as follows:

Acrylic oligomer 5:

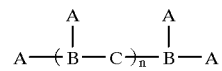

wherein
A: methacrylic acid
B: 2-ethyl-2-hydroxymethyl-1,3-propanediol
C: 4-cyclohexene-1,2-dicarboxylic acid.
Acrylic oligomer 6:

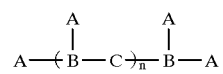

wherein
A: acrylic acid
B: 2-ethyl-2-hydroxymethyl-1,3-propanediol
: pentaerythritol
C: 3-cyclohexene-1,2-dicarboxylic acid
: 4-cyclohexene-1,2-dicarboxylic acid.

TABLE 7

| Ex.No. | Oligomer | | Exposure (mJ/cm$^2$) | Thermal decomposition temp. (° C.) |
|---|---|---|---|---|
| 32 | oligomer 4 | (10.0 g) | 250 | 350 |
| 33 | oligomer 5 | (9.0 g) | 360 | 400 |
| 34 | oligomer 6 | (15.0 g) | 300 | 330 |
| 35 | oligomer 5 + trimethylolpropane triacrylate | (6.0 g) (6.0 g) | 420 | 300 |

TABLE 7-continued

| Ex.No. | Oligomer | Exposure (mJ/cm²) | Thermal decomposition temp. (° C.) |
|---|---|---|---|
| 36 | isocyanuric acid EO-modified (n = 3) triacrylate | (10.0 g) 340 | 360 |
| 37 | pentaerythritol triacrylate | (10.0 g) 400 | 340 |

EXAMPLE 38

A resin composition containing a dimeric imidazole compound initiator was prepared which had the following composition:

Varnish of polyimide precursor: polyimide precursor (14.5% by weight) 50.0 g;

Acrylic oligomer: oligomer 4 represented by the following formula 10.0 g;

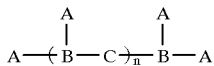

wherein
A: acrylic acid
B: 2-ethyl-2-hydroxymethyl-1,3-propanediol
C: 3-cyclohexene-1,2-dicarboxylic acid
: 4-cyclohexene-1,2-dicarboxylic acid
Photopolymerization initiator: 2,2 -chlorophenyl)-4,4',5,5'-tetraphenyl-1,2'-diimidazole 1.00 g.

A photosensitive solution having the above-described composition was spin-coated onto a silicon wafer having a diameter of 3 in., and the coated wafer was prebaked at 115° C. for 1 hour. The thickness of the film after the prebaking was 16 µm.

A negative type glass mask having a minimum pattern width of 30 µm was provided over the photosensitive plate and the coated and masked plate was irradiated with ultraviolet light by means of an ultraviolet exposing machine at various exposures of 30 to 360 mJ/cm² (365 nm).

The photosensitive plate was subjected to ultrasonic wave development with N-methyl-2-pyrrolidone for 40 seconds, and then the plate was rinsed in ethyl alcohol, thereby developing the plate. The unexposed regions were eluted while the exposed pattern regions only were left on the plate.

The pattern regions were then heated at 300° C. for 30 min. to convert the residual polyimide precursor into a polyimide resin.

The film thickness before and after the curing of the polyimide precursor and the surface roughness of the film after the curing were measured. The results are plotted against the exposure in FIG. 5.

EXAMPLE 39

Using a similar procedure to that in the above Example 38, the film thickness before and after the curing of the polyimide precursor and the surface roughness of the film after the curing were measured, but in this Example, the photopolymerization initiator was replaced by 2,2'-dimethoxy-2-phenylacetophenone. The results are plotted against the exposure in FIG. 6.

Figure 5:
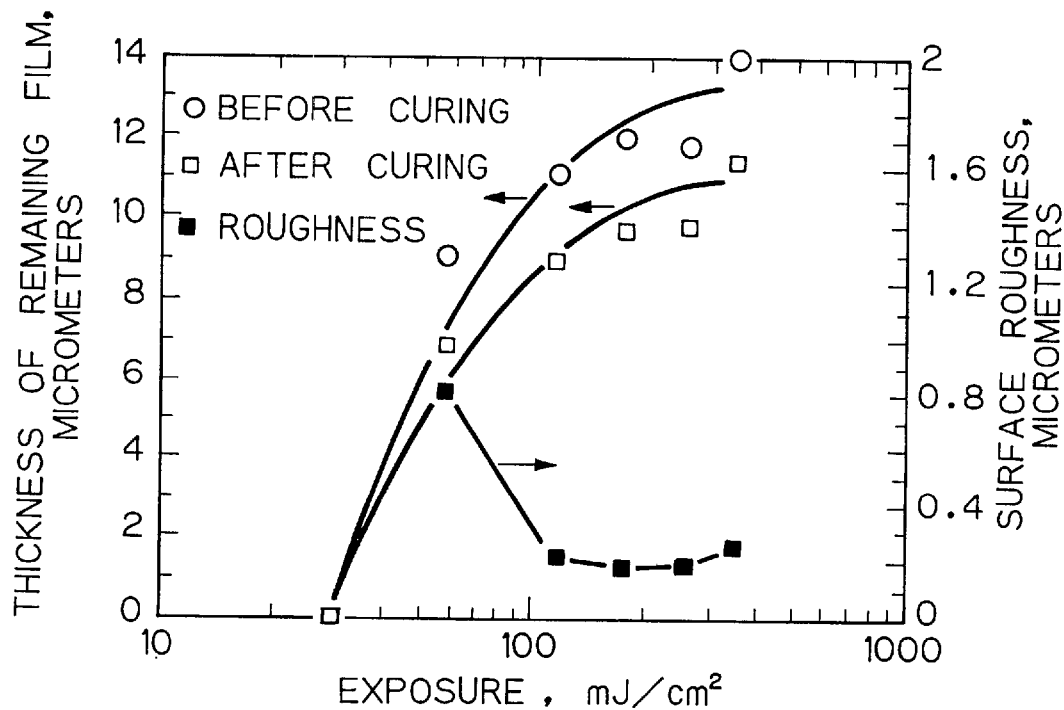
FIGS. 5 and 6 show the relationships between the exposure and the thickness and surface roughness of the resultant film in Examples 38 and 39, respectively.
Figure 6:
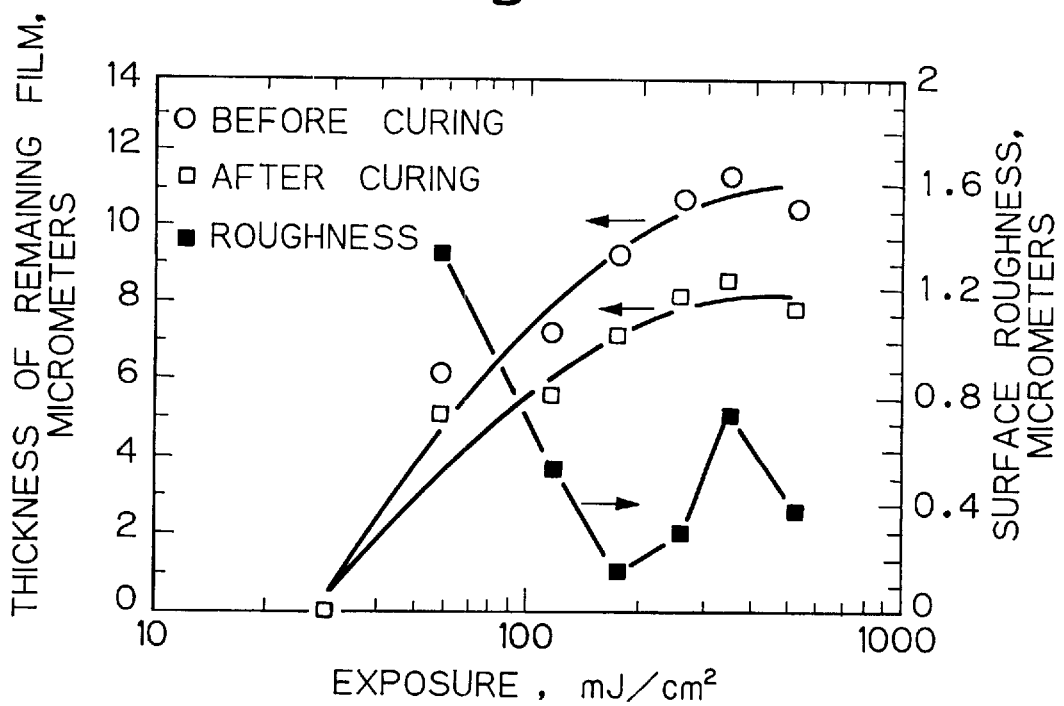

Referring to FIGS. 5 and 6, the thicker the remaining film is at the same exposure, the higher the film sensitivity. The comparison between FIGS. 5 and 6 reveals that the composition containing the dimeric imidazole compound initiator of Example 38 is superior in sensitivity to the composition of Example 38 containing the initiator other than the dimeric imidazole compound. On the other hand, the film after curing of the composition containing the dimeric imidazole compound initiator had a distinctly reduced surface roughness compared with the film resulting from the composition containing the initiator other than the dimeric imidazole compound. Scanning electron microscopy indicated that the greater the surface roughness, the worse the film quality.

EXAMPLE 40

A similar procedure to that in Example 32 was used to form a patterned film, except that the varnish of polyimide precursor was replaced with a varnish of silicone-modified polyimide precursor (13.5% by weight content of precursor in the varnish). The resultant patterned film was observed under a microscope, and no breakage was found in any sample. A test of decomposition of the resultant film revealed that the film was stable up to about 365° C.

As can be appreciated from the above description, a photosensitive, heat-resistant resin can be provided at a low cost through the practice of the present invention. This resin has heat resistance characteristics sufficient for being used as layer insulating films, surface protective films or the like for circuit substrates, printed boards and wiring boards for high-density mounting including multi-chip modules or the like. In addition, the resin of the invention is resistant to temperatures that are greater than soldering temperatures. Further, as opposed to conventional materials and processes, the composition of the invention eliminates the reduction in the film thickness caused by decomposition of the photosensitive groups, which makes it possible to form patterns having a high dimensional accuracy.

Further, according to the present invention, it is possible to provide a useful heat-resistant insulating film which is superior to conventional insulating films in adhesion to a base material and which has a good moisture resistance, excellent properties of the sort that are inherent in the inorganic high-molecular materials, such as phosphazene compounds, including hardness, abrasion resistance and chemical resistance, photosensitivity, heat resistance above the soldering temperature and considerably lower cost than polyimide resins generally. Other effects of the present invention can be easily understood from the above detailed description of the invention.

EXAMPLE 41

0.45 g of purified paraphenylene diamine (PPD) and 0.16 g of 3,3',4,4'-tetraaminobiphenyl.4 hydrochloride-2 hydrate (TABT) were poured into 300 ml of four-necked separable flask, and the mixture was stirred to prepare a solution after addition of 20 g of distilled N-methyl-2-pyrrolidone.

The flask was dipped in an outer water bath maintained at a temperature of 5° C., and, with stirring the solution 1.6 g of purified 3,3',4,4'-benzophenone tetracarboxylic acid dianhydride (BTDA) as a solid was portionwise added to the stirred solution, taking care of avoiding an increase of the temperature of the solution. After addition of all BTDA, stirring was continued to complete a polyaddition reaction of the contents in the flask. An uniform solution of polyamic acid (varnish of polyimide precursor) was thus produced.

25.0 g of tris(acryloyloxyethyl)isocyanate as an acrylic monomer and then 3.0 g of 2,2-dimethoxy-2-phenylacetophenone as a photoreaction initiator were added to 100.0 g of the varnish of polyimide precursor prepared in the above step. A photosensitive solution was prepared.

The resulting photosensitive solution was spin-coated over a retreated silicon (Si) wafer having a diameter of 3 inches, and then the wafer was heated at 100° C., i.e., lower temperature than a boiling point (204° C.) of N-methyl-2-pyrrolidone as a varnish solvent, for one hour to slowly evaporate N-methyl-2-pyrrolidone from the coated film containing the same. As a result of evaporation of the solvent, a "particles-in-matrix microstructure" was produced as is clarified hereinafter.

The dried coated wafer (photosensitive plate) was covered with a glass mask, and exposed to an ultraviolet (UV) radiation at the exposure level of 300 mJ/cm$^2$ (at 365 nm) in an UV exposure apparatus. The acrylic monomer: tris (acryloyloxyethyl)isocyanate was cured as a function of UV exposure.

After the UW exposure, the exposed plate was immersed in a solution of N-methyl-2-pyrrolidone, and developed with an application of ultrasonic. The developed plate was then rinsed with isopropyl alcohol. The unexposed areas were dissolved and removed from the plate. Only the patternwise exposed areas remain on the plate.

Finally, the plate was postbaked at 300° C. for 30 minutes to convert the polyimide precursor in the exposed areas of the plate to the corresponding polyimide resin. The film thickness of the polyimide resin after postbaking was 10 μm.

Figure 10:
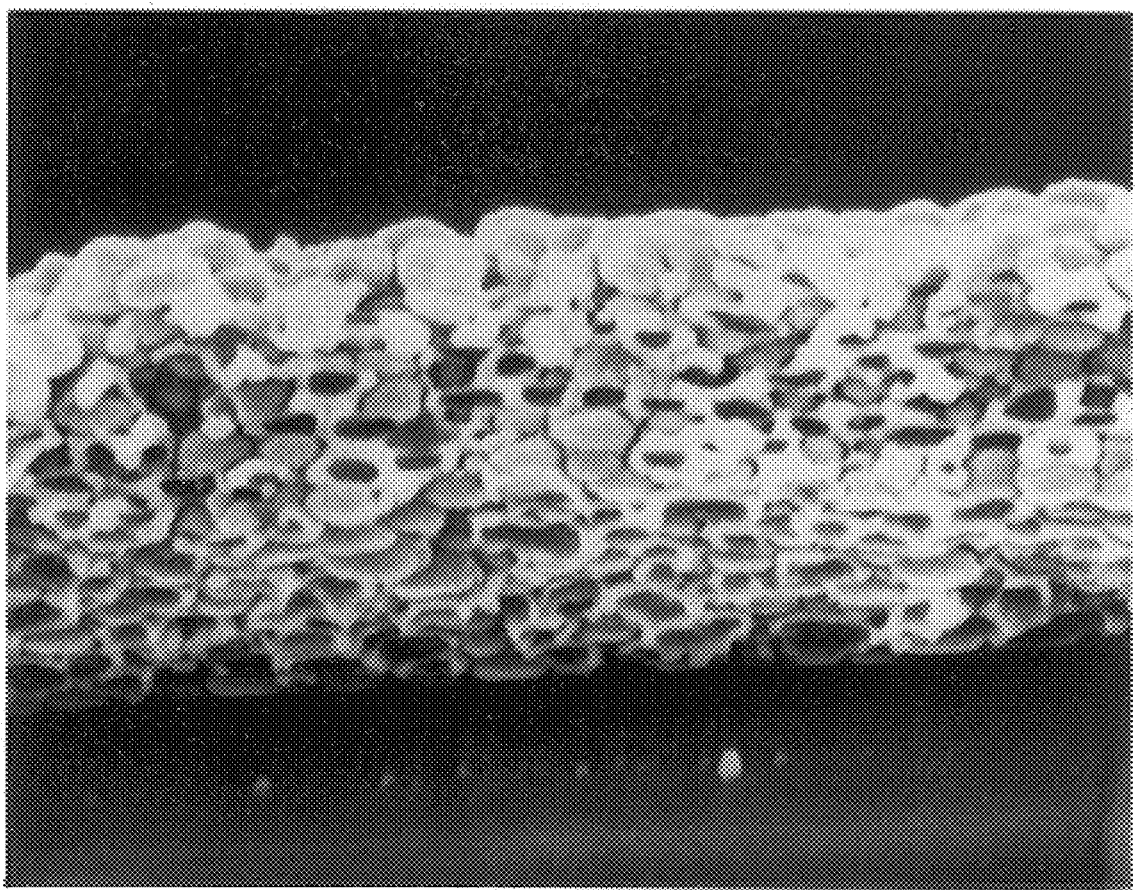
FIG. 10 is a SEM showing a cross-section of the polymeric composite film according to the present invention.
Figure 11:
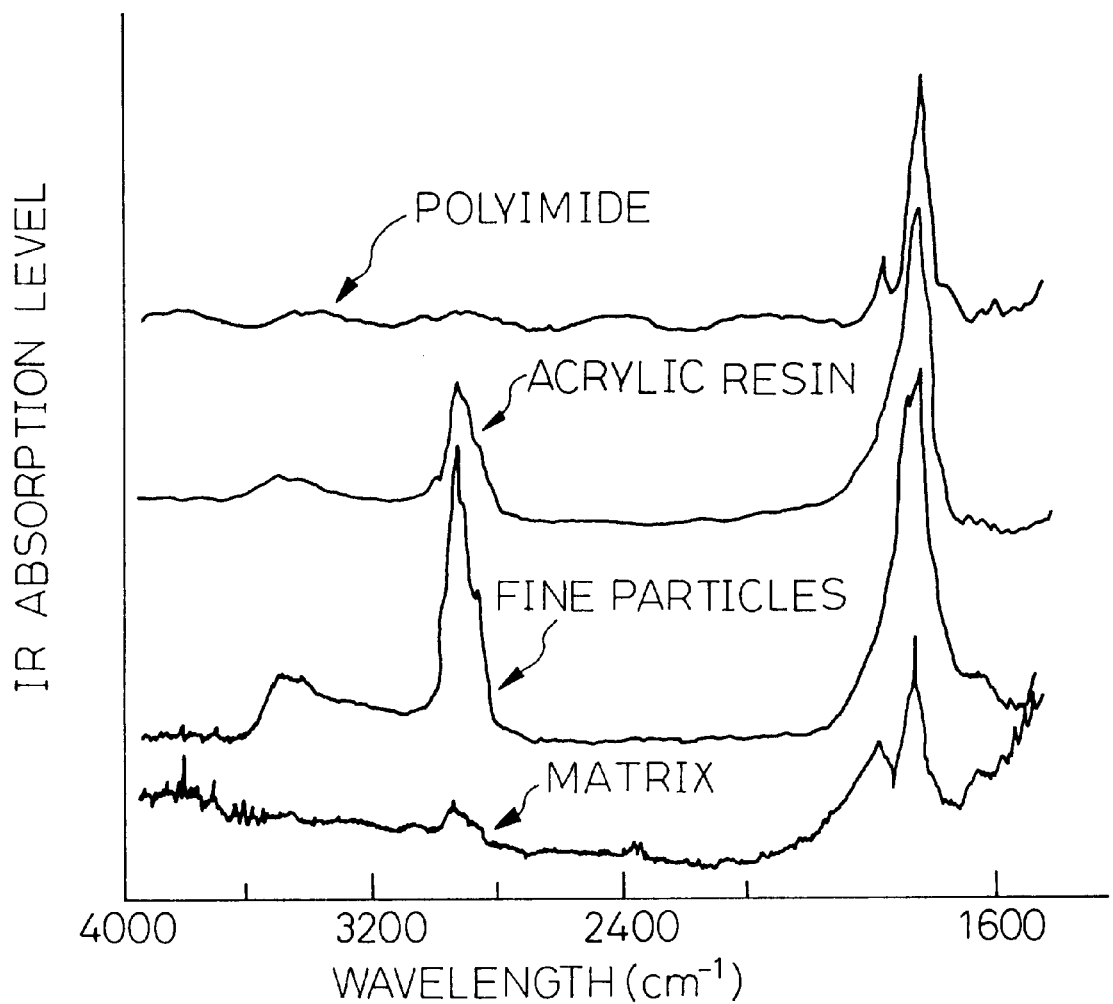
FIG. 11 is a graph of IR absorption spectrum showing a relationship between the wavelength and the IR absorption level.

The resulting film of the polyimide resin was observed in a scanning electron microscopy (SEM) to confirm the formation of a "particle-in-matrix microstructure" in the film. (see, FIG. 10 showing a cross-section of the film and FIG. 8A showing a surface of the viahol of the film). Note in FIG. 10 that some of the acrylic islands are omitted from the SEM photograph. Further, each of the matrix and particles was analyzed in an infrared (IR) analyzer FT-IR to obtain a graph of IR absorption spectrum plotted in FIG. 11. The graph of FIG. 11 evidences that a specific absorption which is inherent to an acrylic resin is observed in the fine particles, and accordingly it is considered that the matrix comprises the polyimide resin and the "particles" comprise the acrylic resin. On the other words, it is considered that in the resulting film of the polyimide resin, finely divided particles of the acrylic resin having a particle size of about 1 to 2 μm have been dispersed in the polyimide resin as a matrix.

EXAMPLE 42

The procedure of Example 41 was repeated except that the temperature for evaporating the solvent was changed to 30° C., 60° C., 90° C. or 120° C., and the prebaking time was shortened to 30 minutes for each case. The each specimen of the films was cut after solidification of the specimen with a liquid nitrogen. The cross-section of the cut specimen was then observed in an environment-type scanning electron microscopy (E-SEM). The results are as follows:

Specimen heated to 30° C.: The film thickness was 24 μm due to a much amount of solvent contained. Separation of "matrix" and "particles" was observed. The size of the particles was relatively large, and in the order of 10 μm.

Specimen heated to 60° C.: The film thickness was slightly reduced (20 μm). Some of the particles was finely divided, and an average size of the particles was in the order of 8 μm.

Specimen heated to 90° C.: The film thickness was further reduced (18 μm). The size of the particles was in the order of 4 μm.

Specimen heated to 120° C.: The film thickness was furthermore reduced (16 μm). The size of the particles was also reduced (order of 1 to 2 μm).

EXAMPLE 43

The procedure of Example 41 was repeated except that the photosensitive solution was prepared in accordance with the following manner and the exposure level of the photosensitive plate to an UV radiation was increased to 500 mJ/cm$^2$ (at 365 nm):

Preparation of a photosensitive solution 1.5 g of purified paraphenylene diamine (PDD), 0.7 g of 4,4'-diaminodiphenylether (4,4'-DPE) and 0.5 g of 3,3',4,4'-tetraaminobiphenyl.4 hydrochloride.2 hydrate were poured into 300 ml of four-necked separable flask, and the mixture was stirred to prepare a solution after addition of 50 g of distilled N-dimethylformamide (DMF).

The flask was dipped in an outer water both maintained at a temperature of 5° C., and, with stirring the solution, 4.5 g of purified anhydrous pyromellitic acid dianhydride (PMDA) as a solid was portionwise added to the stirred solution, taking care of avoiding an increase of the temperature of the solution. A varnish of polyimide precursor was thus produced.

8.00 g of 2-hydroxyethylmethacrylate. 6 substituents (3 PNC-HEMA 6 substituents) as a phosphazenic monomer and then 1.00 g of 2,2'-bis(o-chlorophenyl)-4,4',5,5'-tetraphenyl-1,2'-biimidazole were added to 50.00 g of the varnish of polyimide precursor prepared in the above step. A photosensitive solution was prepared.

Observation of polyimide film

The SEM of the resulting film of the polyimide resin evidences that the film has a particles-in-matrix microstructure. Also, the analysis by using the FT-IR evidences that the matrix comprises the polyimide resin and the particles comprise the phosphazene polymer. From these results, it is considered that in the resulting film of the polyimide resin, finely divided particles of the phosphazene polymer having a particle size of about 1 to 2 μm have been dispersed in the polyimide resin as a matrix.

EXAMPLE 44

15 g of fine particles of acrylic polymer (particle size of 1 to 3 μm) was added to 100 g of a varnish of nonphotosensitive polyimide precursor (resin content of 15% by weight), and the mixture was thoroughly stirred to prepare a coating solution.

The coating solution was spin-coated over a pretreated Si wafer having a diameter of 3 inches, and then the coated film was baked at 120° C., 200° C. or 280° C. for each 30 minutes. The film thickness after postbaking was 10 μm.

A stress of the film was determined from the warpage of the Si wafer in a stress tester: ST-800M commercially available from Canon Inc. The stress of the film was observed to be 27 MPa.

The above procedure was repeated except that the same nonphotosensitive polyimide containing no particles of acrylic polymer was used in place of that containing particles of acrylic polymer. The stress of the film was observed to be 35 MPa.

EXAMPLE 45

The procedure of Example 44 was repeated except that 20 g of fine particles of phosphazenic polymer (particle size of 2 to 4 μm) or 25 g of fine particles of fluorinated polymer (PTFE; particle size of 3 to 5 μm) was used in place of 15 g of fine particles of acrylic polymer (particle size of 1 to 3 μm). The stress of the film was observed to be 25 MPa (for the phosphazenic polymer) or 23 MPa (for the fluorinated polymer).

EXAMPLE 46

Using the film prepared in Example 41, a stress of the film was determined in a stress tester: ST-800M commercially available from Canon Inc. The stress of the film was observed to be 30 MPa.

The same procedure was repeated except that the film of the nonphotosensitive polyimide do not contain fine particles of acrylic polymer. The stress of the film was observed to be 35 MPa.

Next, the same procedure was repeated by using the film prepared in Example 43. The stress of the film, determined from the warpage of the Si wafer, was observed to be 27 MPa.

EXAMPLE 47

The process for the production of a thin film multilevel circuits is described with reference to FIGS. 12A to 12E and FIG. 13.

Figure 12A:
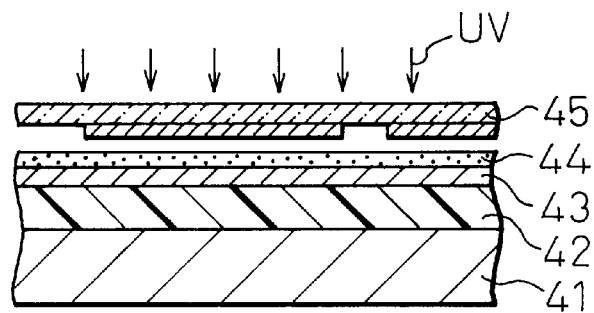
FIGS. 12A to 12E are cross-sectional views showing, in sequence, the formation of the insulating film according to the present invention.
Figure 12B:
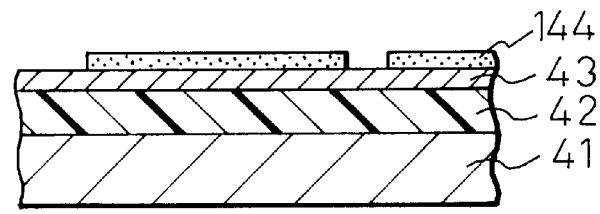

15 g of fine particles of acrylic polymer (particle size of 1 to 3 μm) was added to 100 g of a varnish of nonphotosensitive polyimide precursor (resin content of 15% by weight) prepared in Example 41, and the mixture was thoroughly stirred to form a coating solution. The coating solution was spin-coated and baked over a pretreated Si wafer having a diameter of 3 inches and a thickness of 425 μm. As is illustrated in FIG. 12A, a first insulating layer 42 was formed over the wafer or substrate 41. Therefore, aluminum was deposited by a sputtering method to form a first wiring layer 43.

A positive resist was spin-coated over the first wiring layer 43 to form a resist layer 44, and then, as is also illustrated in FIG. 12A, the resist layer 44 was patten-wise exposed through a mask 45 to an ultraviolet (UV) radiation. After the development of the exposed resist layer 44, a patterned resist layer 144 was obtained (see, FIG. 12B).

Figure 12C:
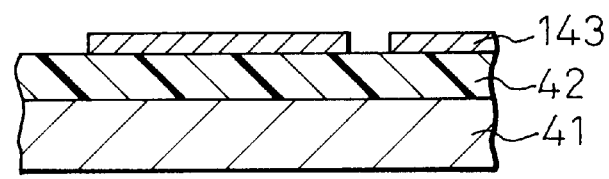
Figure 12D:
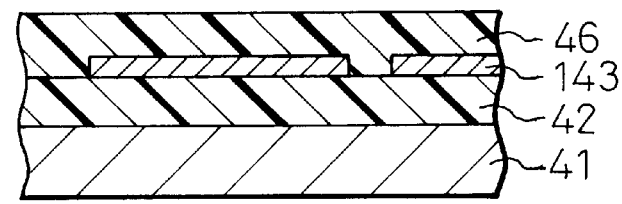
Figure 12E:
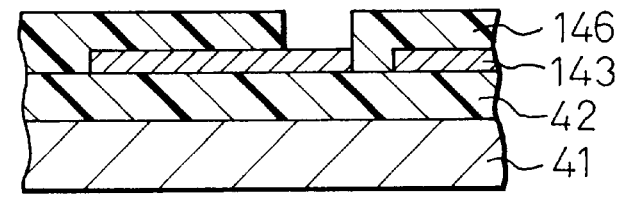

Using the patterned resist layer 144 as a mask, the underlying first wiring layer 43 was selectively etched with a solution of ferric chloride. A patterned wiring layer 143 was thus produced as illustrated in FIG. 12C. Following the patterning of the first wiring layer, a second insulating layer was formed over the patterned first wiring layer. First, 20 g of fine particles of acrylic polymer (particle size of 5 μm) was added to 100 g of a varnish of photosensitive polyimide precursor (resin content of 18% by weight) prepared in Example 43, and the mixture was thoroughly stirred to form a coating solution. Then, the coating solution was spin-coated over the patterned first wiring layer 143, and then prebaked at 90° C. for one hour. As is illustrated in FIG. 12D, a second insulating layer 46 was formed.

The second insulating layer was then covered with a glass mask (not shown) having a viahole pattern, and exposed to the UV radiation at the exposure level of 300 mJ/cm$^2$ (365 nm). The exposed layer was dip-developed with a mixed solution of N-methyl-2-pyrrolidone and xylene with the application of ultrasonic, and then rinsed with isopropyl alcohol. In the second insulating layer, the exposed areas were retained, but the unexposed areas were dissolved and removed. Next, the substrate was postbaked at 140° C. for 30 minutes, and then at 350° C. for 30 minutes. The patterned second insulating layer 146 thus obtained had a layer thickness of 10 μm (see, FIG. 12E).

Figure 13:
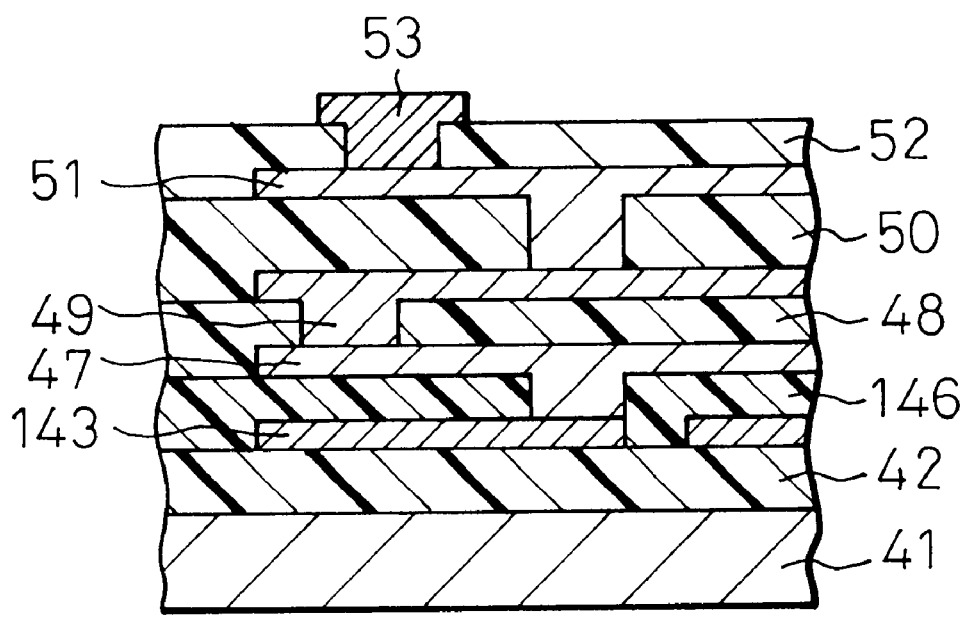
FIG. 13 is a cross-sectional view of the multilevel wiring substrate produced according to the process of FIGS. 12A to 12E.

The above procedure concerning the formation of wiring layer and insulating layer was repeated three times, and finally a pad for fabricating an electrode was formed. As is illustrated in FIG. 13, the multilevel wiring substrate was produced. Note in FIG. 13 that the reference numerals 42, 146, 48, 50 and 52 each means an insulating layer, and the numerals 43, 47, 49, 51 and 53 each means an aluminum wiring layer. In this multilevel wiring substrate, a warpage of the substrate was observed to be 80 μm or less, and no disconnection of the wiring layer was observed in the cross-section thereof.

For the comparison purpose, the above procedure was repeated by using a varnish of nonphotosensitive polyimide precursor (resin content of 15% by weight) having no particles of acrylic polymer (Comparison 1) and a varnish of photosensitive polyimide precursor (resin content of 18% by weight) having no particles of acrylic polymer (Comparison 2). In each of Comparisons 1 and 2, a warpage of the substrate was observed to be more than 100 μm (after formation of the insulating layer 146), and the substrate itself was cracked when it was set in a sputtering apparatus.

We claim:

1. A low-stress electrically insulating layer, comprising a polymeric composite having a particles-in-matrix microstructure including a matrix component consisting essentially of a polyimide resin produced from a heat-induced cyclodehydration reaction of a tetracarboxylic acid dianhydride, an aromatic diamine and a polyhydric amine containing three or more amino groups as principal components thereof, and, having distributed therein, a particles component consisting essentially of a photocured acrylic or phosphazenic resin, wherein the particles-in-matrix microstructure of the polymeric composite is produced upon maintenance of the polymeric composite by providing a mixed solution of a polyamic acid including a reaction product of the tetracarboxylic acid dianhydride, the aromatic diamine and the polyhydric amine, the photocurable acrylic or phosphazenic resin, and a solvent therefor, at a temperature of 30 to 200° C., and wherein the electrically insulating layer has a roughened surface produced upon selective removal of the matrix component from the particles-in-matrix microstructure of the polymeric composite.

2. A process for the production of a low-stress electrically insulating layer including a polymeric composite having a particles-in-matrix microstructure, which process comprises the steps of:

preparing the particles-in-matrix microstructure of the polymeric composite by maintaining the polymeric composites as a mixed solution of a polyamic acid including a reaction product of a tetracarboxylic acid dianhydride, an aromatic diamine and a polyhydric amine containing three or more amino groups as principal components thereof as a matrix component, a photocurable acrylic or phosphazenic resin as a particles component, and a solvent therefor at a temperature of 30 to 200° C.;

evaporating said solvent from said mixed solution to provide the particles-in-matrix microstructure including the polyamic acid and the photocurable resin;

photocuring said photocurable resin with light irradiation;

roughening a surface of the electrically insulating layer by selectively removing the matrix component from the particles-in-matrix microstructure of the polymeric composite; and heating said microstructure, thereby subjecting said polyamic acid to a heat-induced cyclodehydration reaction to form a polyimide resin, thereby providing a particles-in-matrix microstructure consisting essentially of the polyimide resin having distributed therein the particles component consisting essentially of the photocured resin.

3. The process for the production of the low-stress electrically insulating layer according to claim 2, wherein the photocuring and heating steps are carried out in the recited sequence.

4. A process for the production of a low-stress electrically insulating layer including a polymeric composite having a particles-in-matrix microstructure, which process comprises the steps of:

preparing a matrix component as a dispersion of finely divided particles of a photocurable acrylic resin or a phosphazenic resin, which matrix component is dissolved in a particles component which is a solution of a polyamic acid including a reaction product of a tetracarboxylic acid dianhydride, an aromatic diamine and a polyhydric amine containing three or more amino groups as principal components thereof;

photocuring said photocurable resin; and roughening a surface of the electrically insulating layer by selectively removing the matrix component from the particles-in-matrix microstructure of the polymeric composite;

heating the dispersion to cause a heat-induced cyclodehydration reaction of said polyamic acid to form a polyimide resin, thereby providing a particles-in-matrix microstructure consisting essentially of a polyimide resin matrix having dispersed therein the particles component consisting essentially of the finely divided particles of said resin.

5. The process for the production of a low-stress electrically insulating layer according to claim 4, in which the finely divided particles of said resin have an average particle size of 5 $\mu$m or less.

* * * * *

UNITED STATES PATENT AND TRADEMARK OFFICE
CERTIFICATE OF CORRECTION

PATENT NO.: 5,972,807
DATED : October 26, 1999
INVENTOR(S): Motoaki TANI et al.

It is certified that an error appears in the above-identified patent and that said Letters Patent is hereby corrected as shown below:
    Item [75], inventors:

Title Page - change "Motaki" to --Motoaki--

Signed and Sealed this

Twenty-seventh Day of June, 2000

Attest:

Q. TODD DICKINSON

*Attesting Officer*       *Director of Patents and Trademarks*